(12) United States Patent
Bhosale et al.

(10) Patent No.: US 8,946,944 B2
(45) Date of Patent: Feb. 3, 2015

(54) TOGGLE SWITCH AND VARIABLE ACTUATOR CONTROL

(71) Applicant: Pass & Seymour, Inc., Syracuse, NY (US)

(72) Inventors: Vikramsinh P. Bhosale, West Babylon, NY (US); Patrick J. Murphy, Marcellus, NY (US); Richard M. Rohmer, Jordan, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 14/171,460

(22) Filed: Feb. 3, 2014

(65) Prior Publication Data

US 2014/0217920 A1    Aug. 7, 2014

Related U.S. Application Data

(63) Continuation of application No. 12/730,415, filed on Mar. 24, 2010, now Pat. No. 8,643,220.

(51) Int. Cl.
| | |
|---|---|
| *H01H 31/10* | (2006.01) |
| *H05B 41/392* | (2006.01) |
| *H01H 21/36* | (2006.01) |
| *H05B 39/08* | (2006.01) |
| *H03K 17/725* | (2006.01) |
| *G05F 3/04* | (2006.01) |
| *H05B 41/20* | (2006.01) |
| *H03K 17/965* | (2006.01) |

(52) U.S. Cl.
CPC ............ *H05B 41/392* (2013.01); *H01H 21/36* (2013.01); *H05B 39/08* (2013.01); *H03K 17/725* (2013.01); *G05F 3/04* (2013.01); *H05B 41/20* (2013.01); *H03K 17/965* (2013.01)

USPC .......................................... 307/115

(58) Field of Classification Search
USPC .......................................... 307/115
See application file for complete search history.

(56) References Cited

U.S. PATENT DOCUMENTS

| | | | | |
|---|---|---|---|---|
| 5,262,678 | A | * | 11/1993 | Flowers et al. ............... 307/125 |
| 5,293,103 | A | * | 3/1994 | Hanna ........................... 318/268 |
| 5,359,231 | A | | 10/1994 | Flowers et al. |
| 5,637,930 | A | | 6/1997 | Rowen et al. |
| 6,259,351 | B1 | | 7/2001 | Radosavljevic et al. |
| D523,402 | S | | 6/2006 | Lombardi et al. |
| D603,809 | S | | 11/2009 | Mathew et al. |
| 8,124,898 | B2 | * | 2/2012 | Mathew et al. ............... 200/330 |
| 8,350,494 | B2 | * | 1/2013 | Snook et al. .................. 315/291 |
| 8,624,142 | B2 | | 1/2014 | Mathew et al. |

* cited by examiner

*Primary Examiner* — Rexford Barnie
*Assistant Examiner* — Joseph Inge
(74) *Attorney, Agent, or Firm* — Daniel P. Malley; Bond Schoeneck & King, PLLC

(57) ABSTRACT

The present invention is directed to a device for regulating an amount of electrical power provided to at least one electrical load, the device comprising a control circuit disposed in the housing and including at least one switch device movable between a first switch state and a second switch state. The control circuit further includes a power control element that has a power control actuator configured to adjust the amount of power provided to the at least one electrical load. A variable control actuator is accessible to the user via the control aperture and coupled to the power control actuator via a linkage structure. The linkage structure further includes a pin and channel arrangement configured to convert a user control action into a power control actuator adjustment by translating rotational motion into linear motion or linear motion into rotational motion.

91 Claims, 18 Drawing Sheets

SECTION A-A

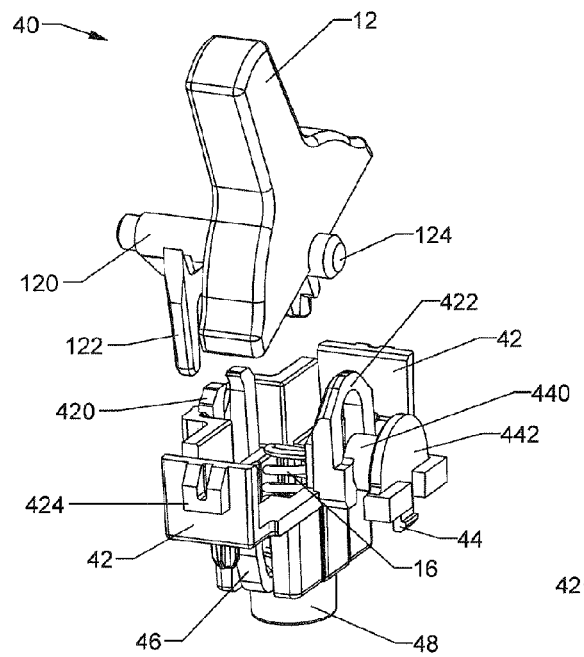
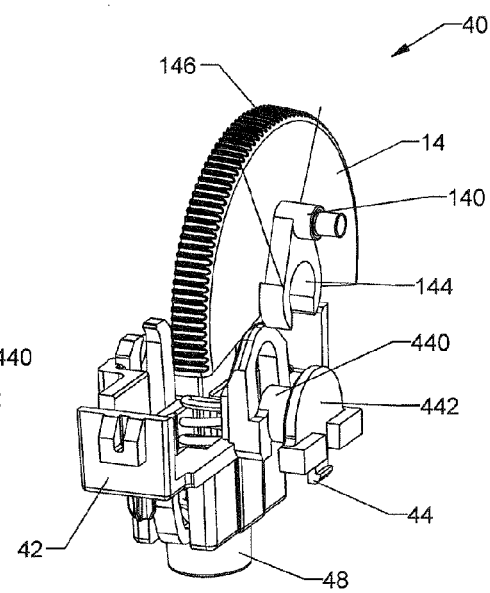
Figure 11A
Figure 11C
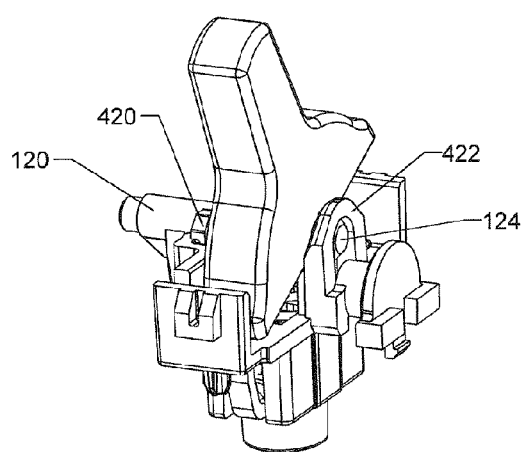
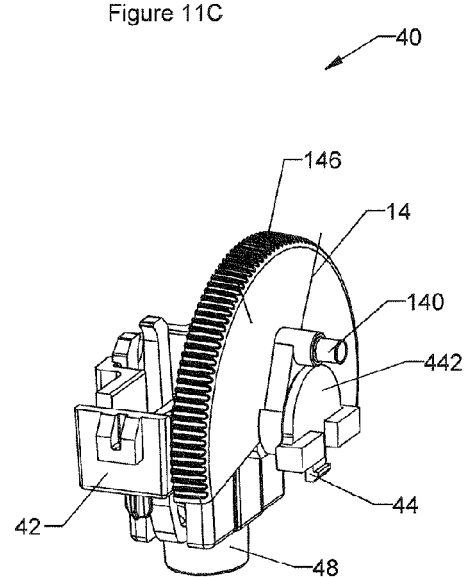
Figure 11B
Figure 11D

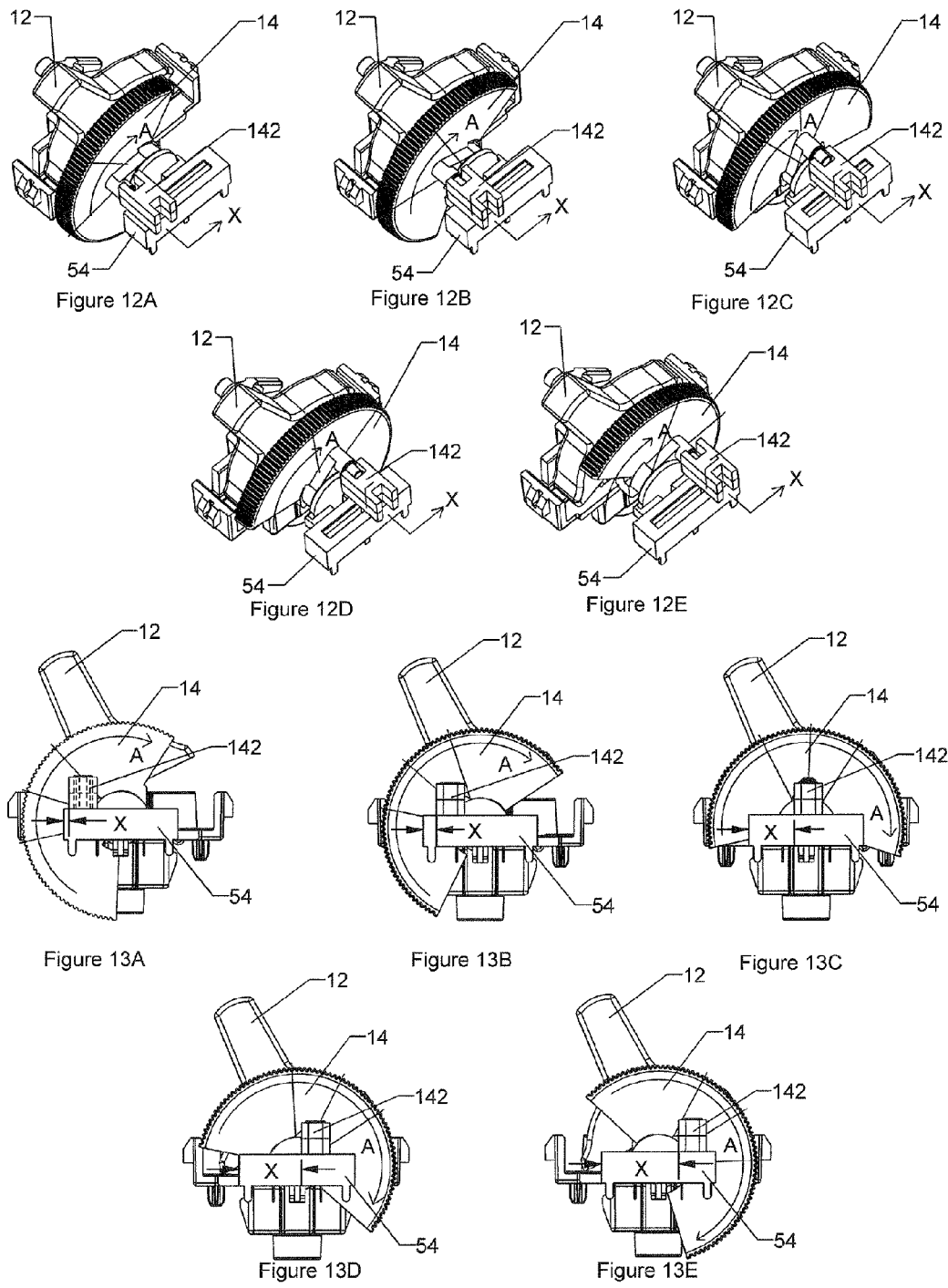

DETAIL A
SCALE 4

TOGGLE SWITCH AND VARIABLE ACTUATOR CONTROL

CROSS-REFERENCE TO RELATED APPLICATIONS

This is a continuation of U.S. patent application Ser. No. 12/730,415, filed on Mar. 24, 2010, the content of which is relied upon and incorporated herein by reference in its entirety, and the benefit of priority under 35 U.S.C. §120 is hereby claimed.

BACKGROUND OF THE INVENTION

1. Field of the Invention

The present invention relates generally to lighting control, and particularly to toggle switch and variable actuator control mechanism 2. Technical Background A toggle switch in combination with a variable actuator control mechanism, e.g., a dimmer, is a device that controls a load with two separate actuators. One of these is a single pole single throw (SPST) switch or a single pole double throw (SPDT) switch. The SPST is an ON-OFF switch that may be connected to a single electrical load or multiple loads in parallel. The SPDT switch may be employed to switch between two loads, i.e., when one load is ON, the other load is OFF, and vice-versa. Two SPDT switches may be employed in combination to control a single load from two separate locations. In each of these examples, a load, such as a lighting device, is either ON or OFF. In addition to the toggle switch, many consumers often prefer a control mechanism that includes a variable actuator control mechanism configured to efficiently control the amount of power being provided to the a, e.g., the intensity of the emitted light. The user may adjust the variable actuator control mechanism setting as needed or as desired. Some variable actuator control mechanisms include automatic variable actuator controls that adjust the light intensity based on ambient light conditions.

A variable actuator control mechanism, such as a dimmer, may be implemented using an RC control circuit in combination with a thyristor such as a TRIAC. The TRIAC is a bidirectional electronic switch that is configured to conduct current in either direction when it is turned ON. The TRIAC may be turned ON by applying a positive or a negative voltage to the TRIAC gate. The TRIAC is a very convenient way to control the amount of AC power consumed by the lighting device because the TRIAC may be turned ON and OFF in response to a pulsed signal applied to the gate. In practice, the ON/OFF cycle of the TRIAC is often controlled by an RC circuit. The resistor portion of the RC circuit is typically implemented using a potentiometer. A potentiometer is a resistor with a sliding contact that forms an adjustable resistance value. The potentiometer is employed by the user to adjust the value of the resistance to thereby change the RC time constant of the RC circuit. Thus, when 60 Hz AC power is applied to the RC circuit, the RC time constant is adjusted via the potentiometer to adjust the duty cycle of the control signal applied to the gate of the TRIAC. When the duty cycle is relatively low, the TRIAC is ON for a relatively small portion of the AC cycle and the light is relatively dim. When the duty cycle is relatively high, the TRIAC is ON for a relatively long portion of the AC cycle and the light appears to be relatively bright. In addition to lighting control circuits, TRIACs may also be employed in speed control circuits for electric motors (e.g., electric fans) and other appliances.

One of the issues of concern to variable actuator control mechanism designers relates to the thermal energy generated by the electrical components of the device. The TRIAC, in particular, generates a significant amount of heat. This concern is exacerbated in toggle switch and variable actuator control mechanisms that include the switch control and variable actuator control within a standard NEMA No. 1 cover plate opening i.e., 0.925" (minimum) high by 0.401" (minimum) wide, because the electrical components tend to be disposed within a central region of the device housing. One common technique for mitigating the thermal energy generated by the components is to mount the TRIAC on a heat sink/ground plane. While the heat sinking of the TRIAC improves the thermal performance of the device, the side of the TRIAC opposite the heat sink is not thermally isolated from the interior of the device housing. What is needed, therefore, is a toggle switch/variable actuator control combination switch designed for a standard NEMA No. 1 cover plate opening that more effectively isolates the TRIAC from the device interior and spatially separates the electrical components to obtain improved thermal performance.

Another issue that is of concern relates to the costs associated with the toggle dimmer assembly. In state of the art devices, the front body member typically includes a framed portion that accommodates both the toggle switch and the dimmer actuator. The toggle actuator and the dimmer actuator are typically fabricated as separate pieces that extend through their respective framing slots and mate with their respective interfaces on the circuit board. One drawback to this approach relates to the time associated with assembling the various and disparate pieces (including the actuator pieces, the interface pieces, etc.). Thus, what is needed is a modular switching assembly that easily incorporates the various pieces of the toggle dimmer assembly such that the entire modular assembly may be snapped in place on the printed circuit board. This approach saves time and therefore money.

SUMMARY OF THE INVENTION

The present invention addresses the needs described above by providing a modular switching assembly that includes a toggle switch/variable actuator control combination switch that addresses the needs described above.

One aspect of the present invention is directed to a device for regulating an amount of electrical power provided to at least one electrical load. The device includes a housing configured to be installed within a wall box. The housing includes a front housing portion coupled to a back housing portion, the front housing portion including a front surface having a control aperture disposed therein. The housing portion further includes a plurality of wiring terminals at least partially disposed in the housing. A control circuit is disposed in the housing, the control circuit further including a variable power control element disposed on a mounting surface. The variable power control element includes a linear actuator configured to vary the amount of power provided to the at least one electrical load based on a linear position of the linear actuator. The linear actuator is substantially perpendicular to the front surface and disposed between the mounting surface and the front surface. A user control assembly is accessible to the user via the control aperture and coupled to the linear actuator via a linkage structure. An adjustable portion of the user control assembly is characterized by a rotational motion about a control axis. The linkage structure includes a pin and channel arrangement configured to convert the rotational motion of the adjustable portion into a linear motion by the linear actuator, the linear actuator being linearly movable within a range of positions. The channel includes parallel walls configured to accommodate the pin, the parallel walls being substantially perpendicular to the mounting surface at each position within the range of positions.

In another aspect, the present invention is directed to a device for regulating an amount of electrical power provided to at least one electrical load, the device comprising a housing configured to be installed within a wall box. The housing includes a front housing portion coupled to a back housing portion, the front housing portion including a control aperture disposed therein. The housing portion further includes a plurality of wiring terminals at least partially disposed in the housing. A control circuit is disposed in the housing and includes at least one switch device movable between a first switch state and a second switch state. The control circuit further includes a power control device disposed on a mounting surface, the power control device including a linear actuator configured to adjust the amount of electrical power. The linear actuator is substantially perpendicular to the front surface. A user-accessible control assembly is coupled to the control circuit via the control aperture. The user-accessible control assembly includes a switch control element coupled to the at least one switch device and a variable control element coupled to the linear actuator via a linkage structure. The variable control element is characterized by a rotational motion about a control axis. The linkage structure includes a pin and channel arrangement configured to convert the rotational motion of the variable control element into linear motion by the linear actuator.

In yet another aspect, the present invention is directed to a device for regulating an amount of electrical power provided to at least one electrical load, the device comprising a housing configured to be installed within a wall box. The housing includes a front housing portion coupled to a back housing portion. The front housing portion includes a control aperture disposed therein. The housing portion further includes a plurality of wiring terminals at least partially disposed in the housing. A control circuit is disposed in the housing and including at least one switch device movable between a first switch state and a second switch state. The control circuit further includes a power control element disposed on a mounting surface. The power control element includes a power control actuator configured to adjust the amount of power provided to the at least one electrical load. A toggle switch actuator is coupled to the at least one switch device and accessible to a user via the control aperture. A variable control actuator is accessible to the user via the control aperture and coupled to the power control actuator via a linkage structure. The linkage structure further includes a pin and channel arrangement configured to convert a user control action into a power control actuator adjustment by translating rotational motion into linear motion or linear motion into rotational motion.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIGS. 11A-11D are exploded and perspective views of the toggle switch and variable actuator in relation to the actuator retainer member;

FIGS. 12A-12E are perspective views of the variable actuator, variable actuator linkage and potentiometer at various potentiometer settings;

FIGS. 13A-13E are side views of the variable actuator, variable actuator linkage and potentiometer at the various potentiometer settings shown in FIGS. 12A-12E;

DETAILED DESCRIPTION

Figure 1:
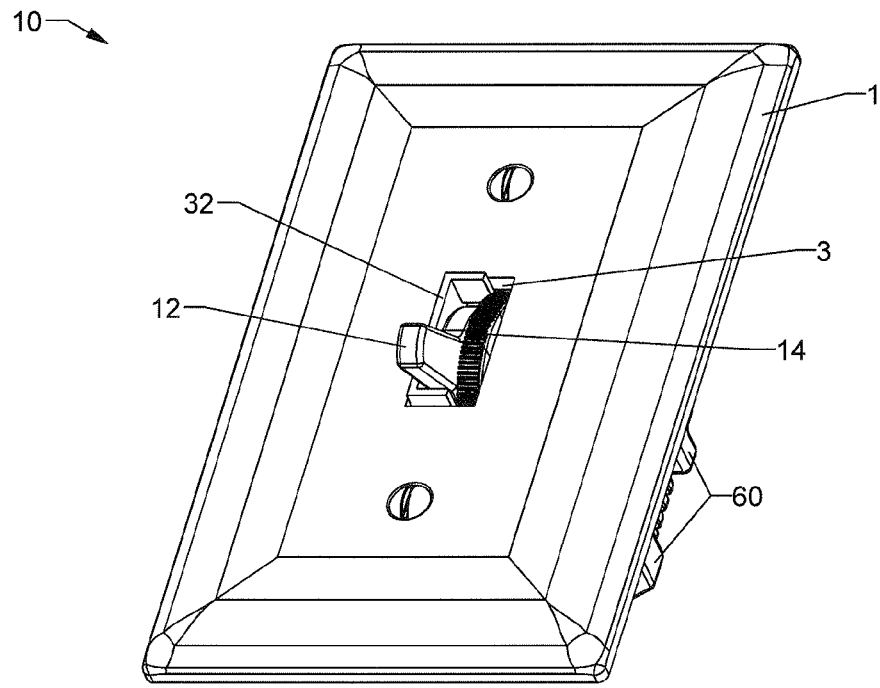
FIG. 1 is a perspective view of a half-frame toggle switch and variable actuator control mechanism with a cover plate in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the toggle switch and variable actuator control device of the present invention is shown in FIG. 1, and is designated generally throughout by reference numeral 10.

As embodied herein, and depicted in FIG. 1, a perspective view of a half-frame toggle switch and variable actuator control device 10 with a cover plate 1 in accordance with an embodiment of the present invention is disclosed. The cover plate 1 includes a standard NEMA No. 1 opening 3. Thus, the dimensions of opening 3 are substantially equal to about 0.925"×0.401". The toggle switch 12 and the rotary variable actuator 14 extend through the wall plate opening 3 such that they are accessible to a user. In this embodiment, a separator member 30 (not shown in FIG. 1) includes a half-frame that extends around the toggle switch 12 and not around the rotary variable actuator 14. Those of ordinary skill in the art will understand that when the load is a light, the rotary variable actuator 14 will be implemented as a dimmer control.

Figure 2:
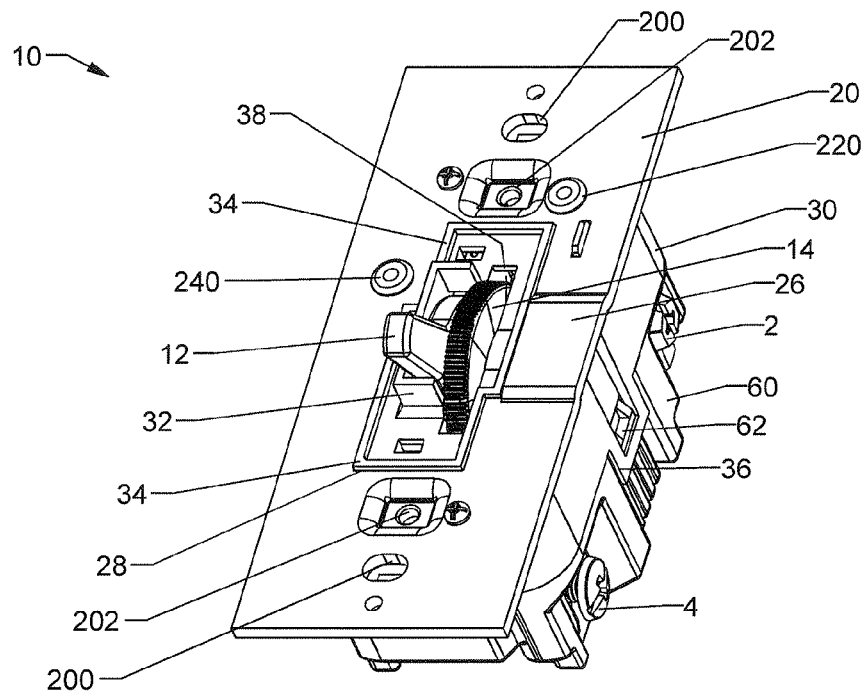
FIG. 2 is a perspective view of the half-frame toggle switch and variable actuator control mechanism depicted in FIG. 1 without the cover plate.

Referring to FIG. 2, a perspective view of the half-frame toggle switch and variable actuator control device 10 depicted in FIG. 1 without the cover plate 1 is disclosed. The heat sink 20, serving as a front cover, includes wall box mounting holes 200 at either end thereof. Closer to the center, the heat sink 20 also includes recessed wall plate fastening holes 202 at either end thereof. The ground terminal post 22 (not shown in this view) is attached to heat sink 20 by rivet 220. TRIAC 24 (also not shown in this view) is attached to heat sink 20 by rivet 240. The heat sink 20 includes a raised portion 26 that formed a variable actuator link recess underneath heat sink 20. The heat sink 20 also includes an irregularly shaped opening 28. Separator 30 includes a registration edge 34 that substantially conforms to opening 28 and aligns the separator 30 with heat sink 20. The half-frame 32 extends from a planar front surface of separator 30 within the boundary formed by registration edge 34. Separator 30 also includes an opening 38 that provides access to the toggle switch 12 and the rotary actuator 14.

The separator 30 is also shown underneath heat sink 20 and includes a latch 36 that mates with back body snap 62. The back body 60 also provides access to various wiring terminals. For example, ground screw terminal 2 is employed to terminate the ground wire to the ground terminal post 22 (not shown in this view). Line hot screw terminal 4 is used to terminate the line hot conductor. If the present invention is configured as a SPDT switch, the other side of the device 10 (not shown in this view) will include two traveler terminals 6 which, of course, are used to terminate traveler wires in a lighting circuit.

As noted above, those of ordinary skill in the art will understand that an SPDT switch may be employed in various types of circuit arrangements. For example, an SPDT switch may be used to switch between two loads, i.e., when one load is ON, the other load is OFF, and vice-versa. Two SPDT switches may be employed in combination to control a single load from two separate locations. Of course, if one of the traveler terminals in left unconnected, the SPDT will function as a SPST switch and can be used to turn the electrical load between the ON and OFF positions. Those of ordinary skill in the art will understand that when the load is a light, the rotary variable actuator 14 will be implemented as a dimmer control.

Figure 3:
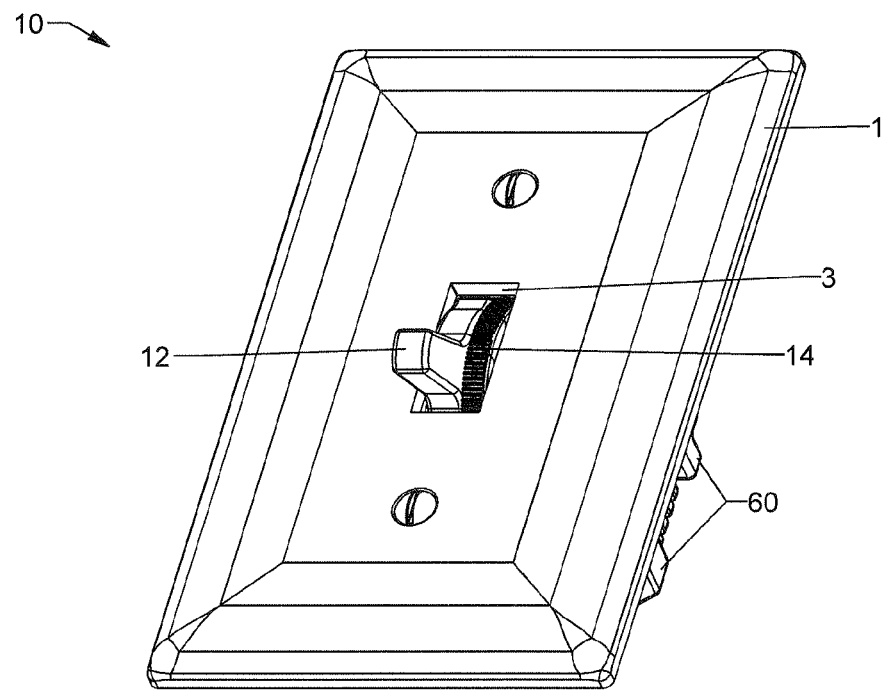
FIG. 3 is a perspective view of a frameless toggle switch and variable actuator control mechanism with a cover plate in accordance with another embodiment of the present invention.

As embodied herein and depicted in FIG. 3, a perspective view of a frameless toggle switch and variable actuator control device 10 with a cover plate 1 in accordance with another embodiment of the present invention is disclosed. The cover plate 1 includes a standard NEMA No. 1 opening 3. The minimum dimensions, therefore, are about 0.925 inches by 0.401 inches or thereabout. The area occupied by the No. 1 opening is less than or equal to about 0.5 inches square. The toggle switch 12 and the rotary variable actuator 14 extend through the wall plate opening 3 such that they are accessible to a user. In this embodiment, the separator member 30 does not include a frame member.

Figure 4:
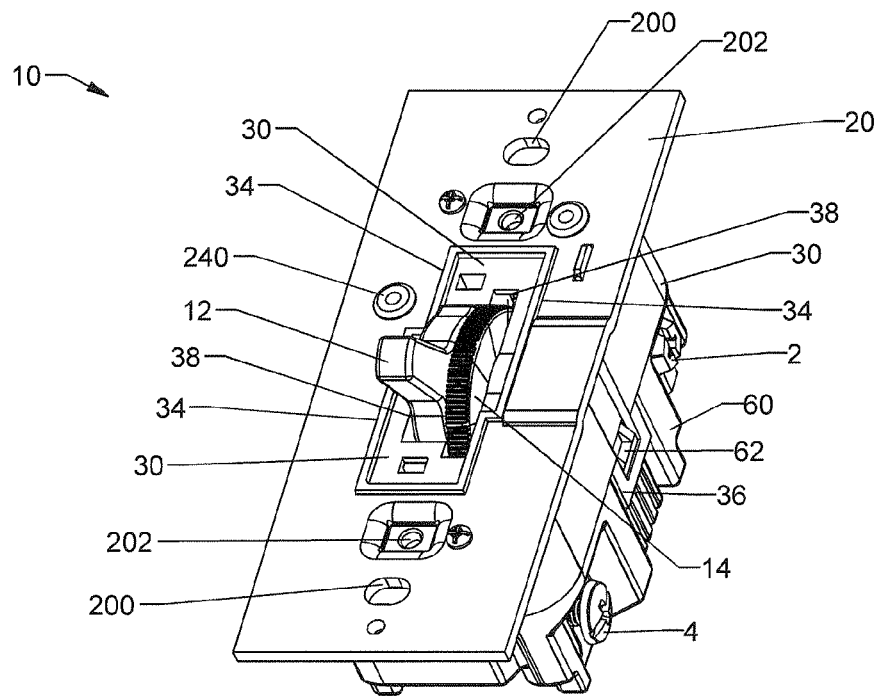
FIG. 4 is a perspective view of the frameless toggle switch and variable actuator control mechanism depicted in FIG. 3 without the cover plate.

Referring to FIG. 4, a perspective view of the frameless toggle switch and variable actuator control device 10 depicted in FIG. 3 without the cover plate 1 is disclosed. All of the features depicted in FIG. 2, and their corresponding reference numerals, are identical in FIG. 4 with the exception that the separator 30 embodiment of FIG. 4 does not include a half-frame 32. Reference is made to U.S. Design Patent Application Nos. 29/352,130 and 29/352,132, both of which were filed on Dec. 17, 2009, which are incorporated herein by reference as though fully set forth in their entirety, for a more detailed explanation of various design features of the toggle actuator 12, rotary actuator 14 and frameless or half-framed separator 30.

Figure 5:
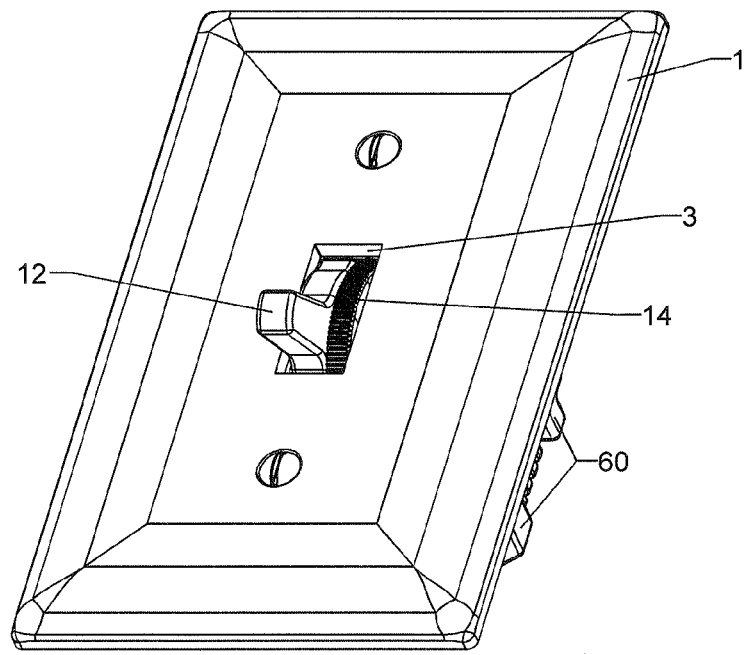
FIG. 5 is a perspective view of a frameless toggle switch and variable actuator control mechanism with a cover plate in accordance with another embodiment of the present invention.

Referring to FIG. 5, a perspective view of a frameless toggle variable actuator switch 10 with a cover plate 1 in accordance with another embodiment of the present invention is disclosed. The cover plate 1 again includes a standard NEMA No. 1 opening 3. The toggle switch 12 and the rotary variable actuator 14 extend through the wall plate opening 3 such that they are accessible to a user. Once again, in this embodiment, the separator member 30 does not include a frame member.

Figure 6:
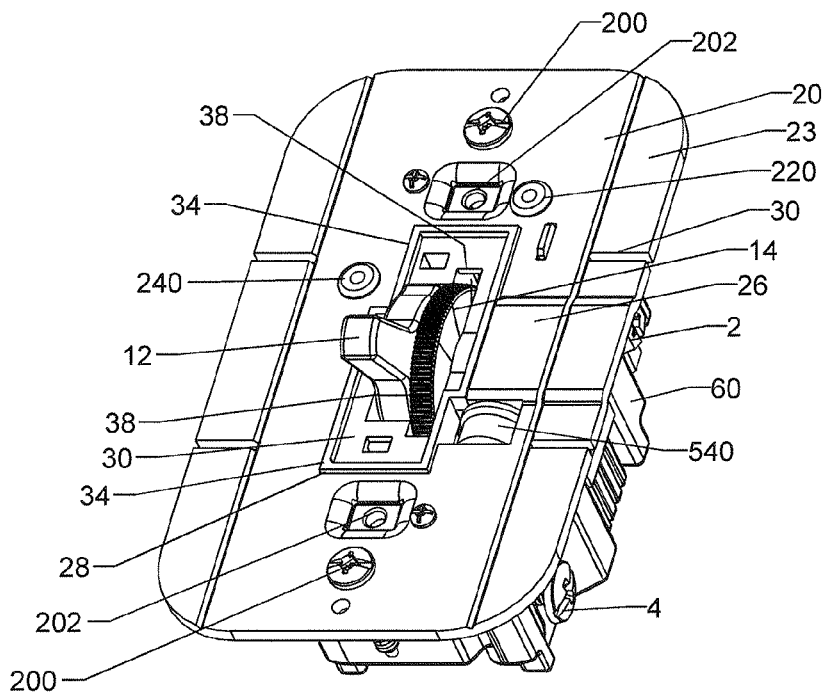
FIG. 6 is a perspective view of the frameless toggle switch and variable actuator control mechanism depicted in FIG. 5 without the cover plate.

FIG. 6 is a perspective view of the frameless toggle variable actuator switch depicted in FIG. 5 without the cover plate. All of the features depicted in FIGS. 2 and 4, and their corresponding reference numerals, are almost identical in FIG. 6. Like FIG. 4, the separator 30 embodiment of FIG. 6 is frameless. The embodiment depicted in FIG. 6 differs from the previous embodiments in two other respects. First, the heat sink 20 includes removable tab members 23. The heat sink 20 in this embodiment is configured for a relatively higher power handling (e.g., 700 W vis á vis 1100 W) and the related heat dissipation. The other difference relates to the presence of the preset variable actuator control 540. One will immediately note that the preset variable actuator control 540 is hidden behind cover plate 1 in FIG. 5. The preset variable actuator control 540, as its name suggests, allows a user to manually preset the low end of the variable actuator control. If the variable actuator control is a dimmer, the preset variable actuator control 540 will preset the low end of the light intensity such that dimmer actuator 14 may vary the light intensity from the preset low end intensity to the maximum intensity provided by the lighting. Once the preset level is set, the user may install the cover plate 1 such that the preset variable actuator control 540 is hidden.

Figure 7:
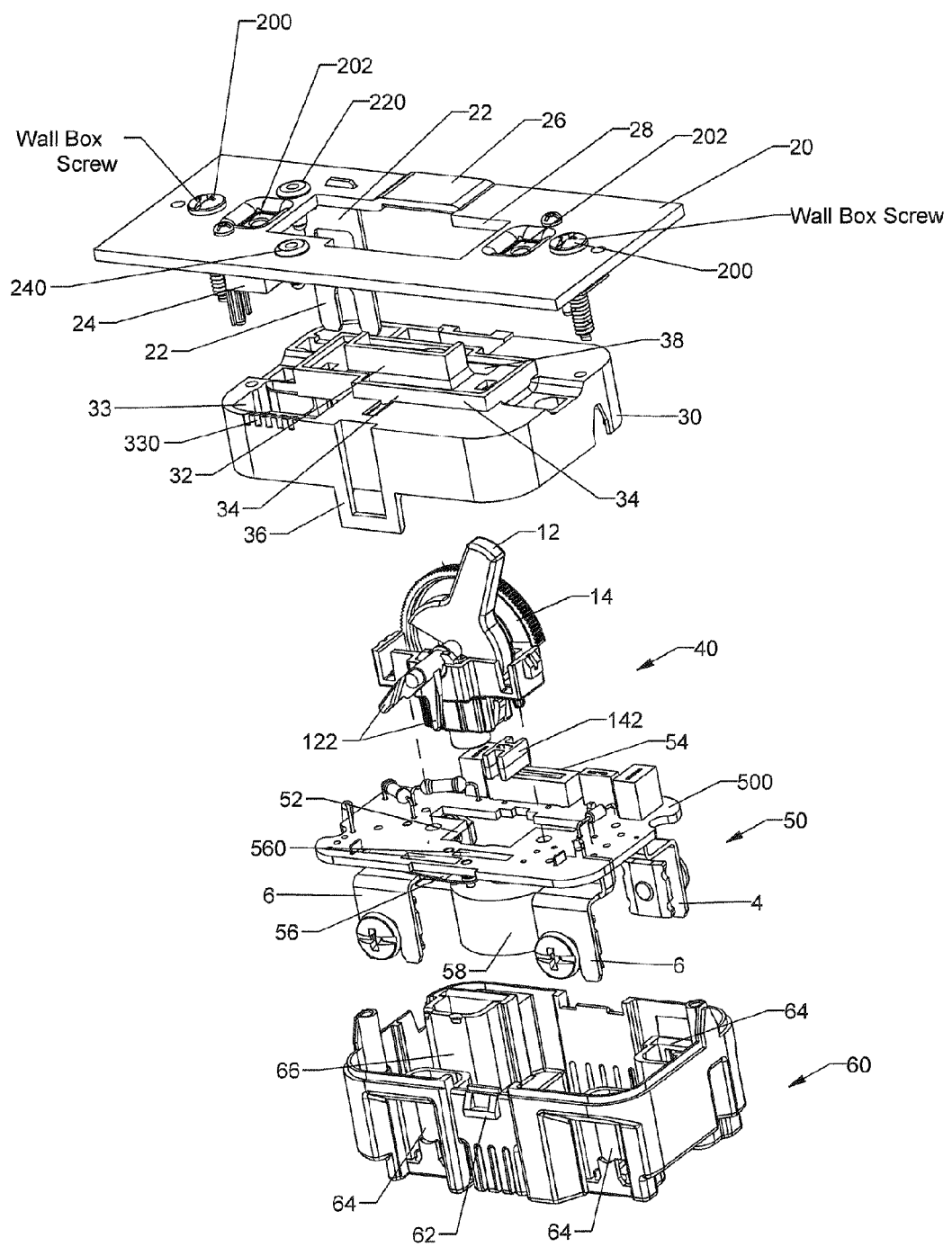
FIG. 7 is an exploded view of the toggle switch and variable actuator control mechanism depicted in FIGS. 1 and 2.

Referring to FIG. 7, an exploded view of the toggle variable actuator switch device 10 depicted in FIG. 1 is disclosed. Again, the heat sink 20 includes wall box mounting holes 200, ground terminal rivet 220, and TRIAC rivet 240. The heat sink 20 includes a raised portion 26 that formed a variable actuator link recess underneath heat sink 20. The heat sink 20 also includes an irregularly shaped opening 28 that registers and aligns with separator 30. A ground terminal 22 is mounted to the underside of the heat sink 20 by rivet 220. TRIAC 24 is also mounted to the underside of the heat sink via rivet 240. As those of ordinary skill in the art will appreciate, the TRIAC 24 is one example of an electronic power regulator used to control the amount of AC power consumed by an electrical load.

As described above, separator member 30 includes a half-frame 32, a registration member 34, a latch 36 and an opening 38. Separator 30 also includes a pocket 33 that is configured to accommodate TRIAC 24. The pocket 33 includes a vented portion 330 formed in the side wall of separator 30. The vented pocket 33 provides a thermal barrier between the TRIAC 24 and the printed circuit board assembly 50. In particular, there is a pocket floor (not shown) that is disposed between the TRIAC 24 and the circuit board assembly 50 when the device 10 is assembled.

The toggle switch 12 and the rotary variable actuator 14 are disposed in a modular actuator retainer assembly 40 that snaps into printed circuit board 500 in a manner that will be subsequently explained.

The printed circuit board assembly 50 includes various components mounted on a printed circuit board 500 that also provides electrical circuit traces that electrically interconnect the various components. The modular actuator retainer assembly 40 is configured to be mounted within a central opening 52 formed in a central portion of circuit board 500. A slide potentiometer 54 is disposed on one side of opening 52 along a lateral edge of circuit board 500. A linkage element 142 is connected to the slide portion of the slide potentiometer. The linkage element 142 couples to another linkage element (not shown in this view) disposed on the rotary variable actuator 14. Switch traveler contacts 56 are disposed on the opposite side of opening 52 along the opposing lateral edge of circuit board 500. In the example embodiment of FIG. 5, there are two travelers 56 disposed on the underside of printed circuit board 500 and are accessible to toggle switch actuators 122 via slots 560 formed in printed circuit board 500. Each of the two travelers is connected to a corresponding traveler terminal 6 via printed circuit board connections. One of the travelers is connected to the line hot terminal 4 depending on the state of toggle switch 12. A toroidal choke 58 is connected to the circuit board 500 at one end thereof and is cantilevered in the manner shown under opening 52.

The printed circuit board assembly 50 is inserted into the back body member 60 such that the terminals 2, 4, 6 are accessible via the recessed portions 64. The back body snap 62 mates with the latch 36 of the separator 30.

Figure 8:
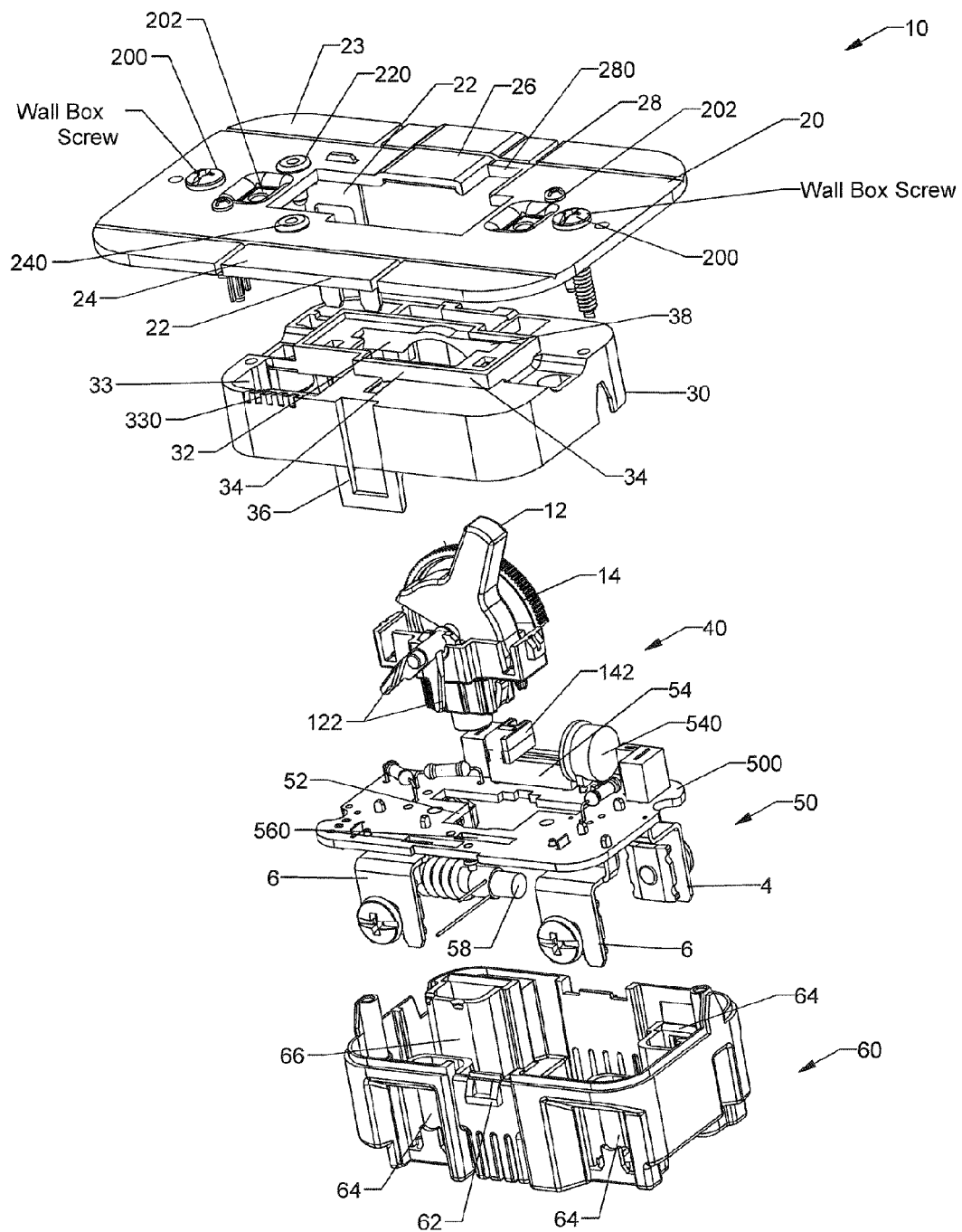
FIG. 8 is an exploded view of the toggle switch and variable actuator control mechanism depicted in FIGS. 5 and 6.

As embodied herein and depicted in FIG. 8, an exploded view of the toggle switch and variable actuator control mechanism depicted in FIGS. 5 and 6 is disclosed. The embodiment depicted in FIG. 8 is quite similar to the embodiment shown in FIG. 7. Thus, the description provided herein omits repetitive features. As noted above, the heat sink 20 in this embodiment is configured for a relatively higher power handling and the related heat dissipation. The heat sink 20 includes tabs 23 that may be removed by the installer. The separator 30 shown in this view is frameless. The modular switch actuation assembly 40 is identical to that depicted in the previous drawings. This embodiment also depicts the preset variable actuator control 540 in relation to variable actuator 54 and printed circuit board 500. When device 10 is assembled, the preset variable actuator control 540 extends though opening 39 in separator 30 and opening 280 in heat sink 20 such that it is accessible to the user before the cover plate 1 is installed (See FIGS. 5 and 6). The choke coil 58 in this embodiment is relatively more robust than the choke coil shown in FIG. 7 because it must handle the higher currents associated with the higher power rating (e.g., 1100 W).

Figure 9:
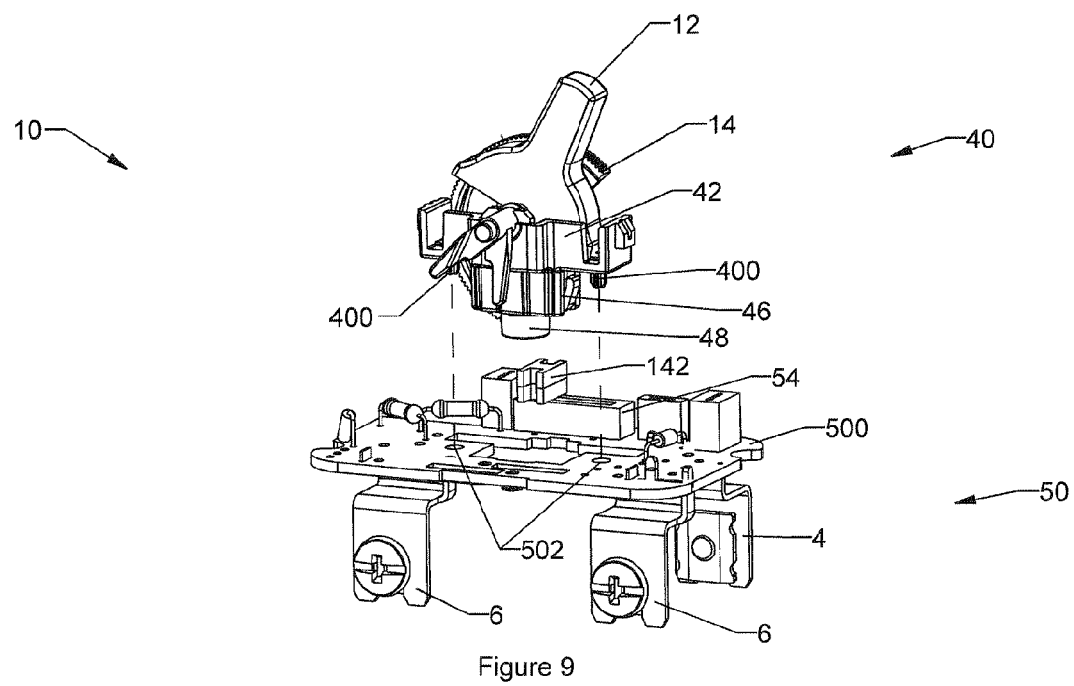
FIG. 9 is an exploded view of the toggle switch and variable actuator control mechanism and printed circuit board in accordance with the embodiments of either FIG. 1 or FIG. 3.

FIG. 9 is an exploded detail view of the modular actuator retainer assembly 40 and printed circuit board assembly 50 in accordance with the embodiments of either FIG. 1 or FIG. 3. Note that modular actuator retainer assembly 40 includes snap elements 400 disposed in the upper body portion 42. The snap elements 400 are configured to be inserted into openings 502 in the printed circuit board 500. Thus, the lower body portion 46 of the modular switch actuation assembly 40 is inserted into opening 52 and extends under the printed circuit board 500 in a manner that is described in more detail below.

Figure 10A:
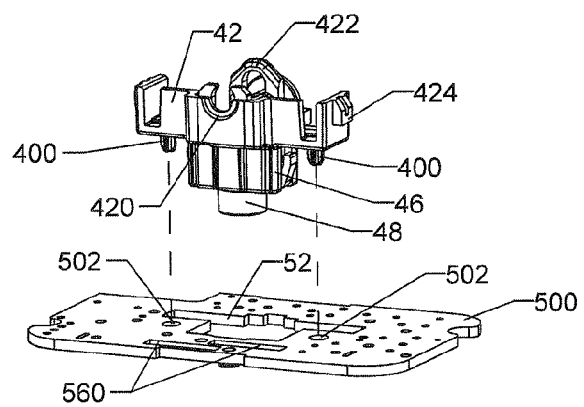
FIGS. 10A-10B are various views of the actuator retainer and printed circuit board in accordance with the embodiments of either FIG. 1 or FIG. 3.
Figure 10B:
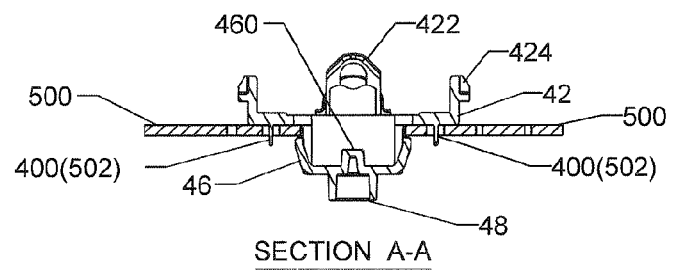

FIGS. 10A-10B are various views of the actuator retainer and printed circuit board in accordance with the embodiments of either FIG. 1 or FIG. 3. FIG. 10A shows the modular actuator retainer assembly 40 without the toggle switch 12 or the rotary variable actuator 14. The upper actuator retainer portion 42 includes a trunnion lock 420 and a trunnion slot 422 that engage trunnions integrally formed on either side of the toggle switch 12. The trunnions, of course, are small cylindrical projections on either side of the toggle switch 12 that define a switch axis of rotation upon which toggle switch 12 pivots in response to user actuation. The upper actuator retainer portion 42 also includes upper portion snap elements 424 on either end thereof. The upper portion snap elements 424 mate with a portion of the separator member 30 during assembly, in a manner that will be described in more detail below. The modular actuator retainer assembly 40 also includes a lower actuator retainer portion 46 that is inserted into the central opening 52 of printed circuit board 500 and extends below the printed circuit board 500 when the snap elements 400 are inserted into openings 502. The lower actuator retainer portion 46 includes a choke stand-off portion 48 that extends therefrom. The choke stand-off 48 prevents the toroidal choke 58 from interfering with rotary variable actuator 14.

FIG. 10B is a cross-sectional view of the printed circuit board 500 along a central longitudinal axis with the printed circuit board 500. As the lower actuator retainer portion 46 is inserted into opening 52, the choke stand-off member 48 is seen to be in substantial alignment with a vertical axis that includes the trunnion lock 420, the trunnion slot 422, and a switch spring retainer portion 460 formed in the interior of the lower actuator retainer portion 46. The switch spring retainer portion 460 will be described in more detail below in conjunction with a detailed description of the toggle switch 12.

Referring to FIGS. 11A-11D, exploded views of the toggle switch 12 and the rotary variable actuator 14 in relation to the modular actuator retainer assembly 40 are disclosed. FIG. 11A shows toggle switch 12 in relation to the actuator retainer 40. In particular, toggle switch 12 includes a trunnion 120 that mates with trunnion lock 420. Trunnion 120 includes toggle switch actuators 122 extending from an underside portion of the trunnion 120 at a location outboard of where trunnion 120 mates with trunnion lock 420. Toggle switch 12 also includes a relatively short trunnion 124 that is configured to be inserted into trunnion slot 422. As noted previously, trunnion 120 and trunnion 124 are cylindrical elements that define the axis of rotation of the toggle switch 12. As switch 12 rotates between the double-throw switch positions, the actuators 12 move accordingly. FIG. 11B is a perspective view of FIG. 11A that shows the toggle switch 12 within the modular actuator retainer assembly 40.

FIG. 11A also shows a shaft 440 that includes an end stop 442. These elements are disposed in a side-by-side relationship with trunnion slot 422 and are employed to seat the rotary variable actuator 14 within the modular actuator retainer assembly 40 alongside the toggle switch 12. Thus, the toggle switch 12 is separated from the rotary variable actuator 14 only by the relatively thin width of the trunnion slot 422.

FIG. 11C is an exploded view that shows the rotary variable actuator 14 in relation to the actuator retainer 40. As an initial point, the rotary variable actuator 14 is not fully circular; the solid portion of the rotary variable actuator 14 constitutes a reflex angle, i.e., an angle greater than 180 degrees. The cutaway portion of the variable actuator 14, therefore, forms an obtuse angle (i.e., between 90 and 180 degrees). Thus, the sum of the reflex angle and the obtuse angle must equal 360 degrees. The cutaway portion of the variable actuator 14 represents both a cost and a space savings. The cutaway portion reduces the size of the variable actuator 14. This feature results in a modular actuator retainer assembly 40 with a reduced profile. In turn, the overall device thickness is reduced. The spatial savings results material savings which reduces costs.

The rotary variable actuator 14 includes a linkage portion 140 that mates with the previously described linkage portion 142 to actuate the slide potentiometer 54. The rotary variable actuator 14 also includes a snap pocket 144 that is configured to mate with the barrel trunnion 440. The rotary variable actuator 14 is prevented from slipping off the end of the shaft 440 by the end stop 442. Finally, the rotary variable actuator 14 includes a serrated portion 146 that provides the user with a tactile surface when adjusting the rotary variable actuator 14. FIG. 11D is a perspective view of FIG. 11C that shows the rotary variable actuator 14 assembled within the modular actuator retainer assembly 40.

Referring to FIGS. 12A-12E, perspective views of the variable actuator 14, variable actuator linkage 142 and potentiometer 54 at various potentiometer settings are disclosed. In particular, these views illustrate the relationship between the angular rotation amount (A) and the linear displacement (X) of potentiometer 54. FIGS. 13A-13E are side views of the variable actuator, variable actuator linkage and potentiometer at the various potentiometer settings shown in FIGS. 12A-12E. Note that variable actuator linkage member 140 is disposed within a pocket formed within the H-shaped linkage member 142. The H-shaped linkage member 142 is disposed on the slide portion of the slide potentiometer 54. As the variable actuator 14 is rotated clockwise, the linkage member 140 also rotates such that linkage member 142 moves from left-to-right along the slide potentiometer 54. Thus, FIGS. 12A and 13A show the linkages (140, 142) at the farthest counter-clockwise position of the rotary variable actuator 14. This position, of course, corresponds to the lowest potentiometer 54 setting. In each successive Figure, the rotary variable actuator 14 is moved incrementally in the clockwise direction to move the slide potentiometer incrementally rightward until the slide potentiometer 54 is at its maximum setting in FIGS. 12E and 13E.

Figure 14A:
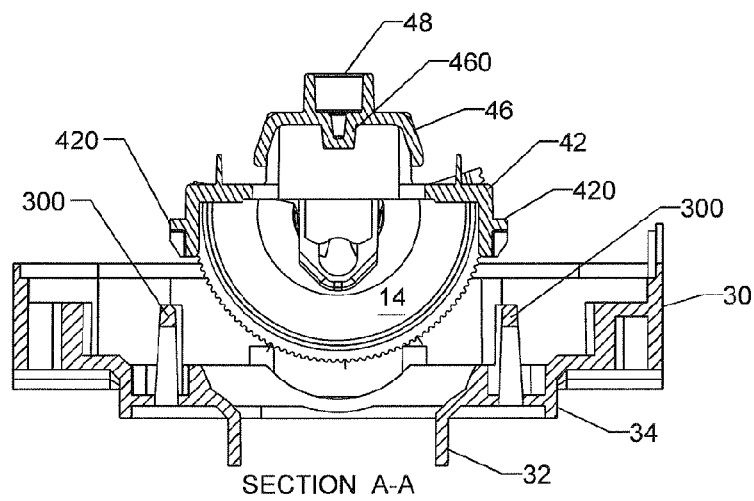
FIGS. 14A-14C are cross-sectional views illustrating the assembly of the modular switch actuation assembly and the separator in accordance with the present invention.
Figure 14B:
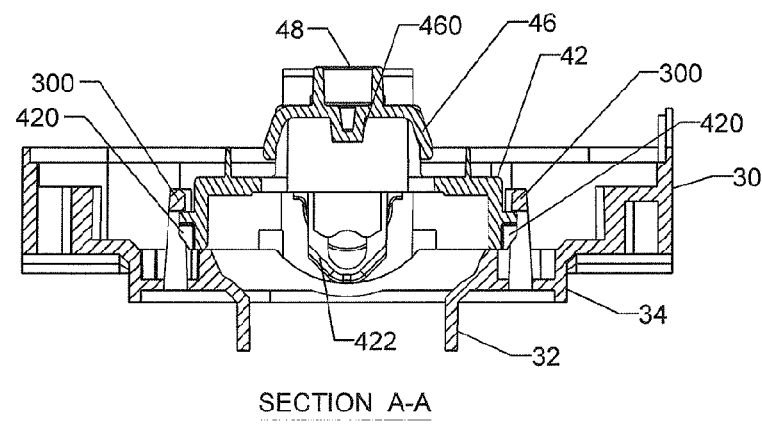
Figure 14C:
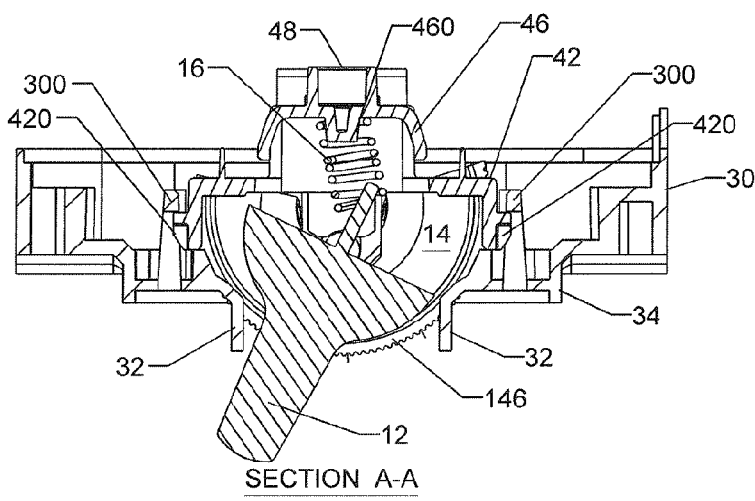

FIGS. 14A-14C show various cross-sectional views that illustrate the assembly of the modular switch actuation assembly 40. FIG. 14A is an exploded cross-sectional view of the actuator retainer and variable actuator disposed within the half-framed separator member 30 depicted in FIG. 1. The choke stand-off member 48 is shown at the very top of the drawings. As noted above, the choke stand-off 48 prevents the toroidal choke 58 (not shown in this view) from interfering with rotary variable actuator 14. Thus, the toroidal choke 52 is disposed between the choke stand-off member 48 and the rear inside major surface of the back body 60. The actuator retainer is shown with the rotary variable actuator 14 attached thereto. The toggle switch 12 is omitted for the sake of clarity. The separator 30 includes retainer guide members 300 which mate with the snap elements 420 of the upper actuator retainer portion 42.

FIG. 14B is a cross-sectional view of the modular actuator retainer assembly 40 that shows the snap elements 420 mated with the retainer guide members 300. FIG. 14B omits both the toggle switch 12 and the rotary variable actuator 14 for the sake of clarity of illustration. Taken together, FIGS. 14A and 14B illustrate the assembly of the modular actuator retainer assembly 40 within the separator member 30. The only difference between this embodiment and the embodiment depicted in FIG. 3 is that the embodiment of FIG. 3 does not include a frame 32 around the toggle switch 12 and the rotary variable actuator 14.

FIG. 14C is a cross-sectional view of the actuator retainer, toggle switch and variable actuator disposed within the half-framed separator member depicted in FIG. 1. Like FIG. 14B, FIG. 14C is a cross-sectional view of the modular actuator retainer assembly 40 that shows the snap elements 420 mated with the retainer guide members 300. Essentially, FIG. 14C shows a fully assembled actuator retainer whereas FIG. 14B does not include any components. Thus, the switch spring retainer portion 460, which is formed in the interior of the lower actuator retainer portion 46, is coupled to the toggle switch spring 16 at one end thereof. The other end of the spring 16 is connected to a bottom portion of the toggle switch. Thus, when a user toggles from a first switch position to a second switch position, spring element 16 applies a force that causes the toggle switch 12 to snap into the appropriate switch position. The handle portion of toggle switch 12 extends though the half-frame 32 and is accessible by the user.

Figure 15:
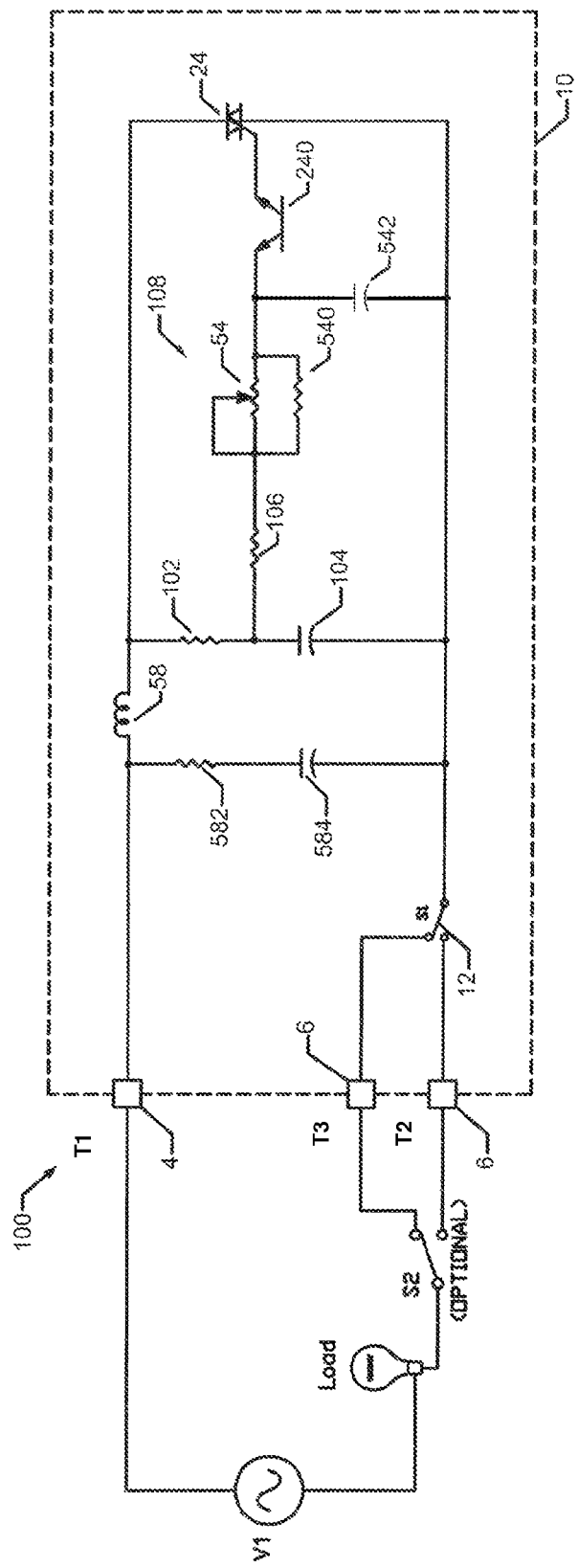
FIG. 15 is a schematic view of a circuit for a toggle switch and a variable actuator control in accordance with an embodiment of the invention.

As embodied herein and depicted in FIG. 15, a schematic view of a circuit for a toggle switch and a variable actuator control in accordance with an embodiment of the invention is disclosed. The dashed line indicates the portion of the schematic 100 that is disposed within device 10. Line hot terminal is connected to the source of AC power (V1). Traveler terminals 6 are connected to the traveler wires that extend from wall switch S2. Switch S2 is also connected to the source of AC power (V1) to complete the circuit. The traveler terminals 6 are also connected to the toggle switch 12 which turns device 10 ON/OFF.

Circuit 100 includes an RLC circuit that includes choke coil 58 in combination with resistor 582 and capacitor 584. The RLC circuit is configured to prevent device 10 from propagating electrical noise generated by TRIAC Q1 back towards AC source V1 and the electrical distribution system.

An RC circuit formed by resistor 102 and capacitor 104 is employed as a voltage regulation filter that substantially eliminates spurious high frequency noise from being transmitted to the variable actuator timing circuit 108. As those skilled in the art will appreciate, high frequency noise could be improperly interpreted by timing circuit 108 as an AC signal phase angle corresponding to the time to turn ON. By filtering out high frequency noise, the RC circuit helps maintain the proper timing of circuit 100. The variable actuator circuit 108 includes current limiting resistor 106 coupled to an RC circuit that includes potentiometer 54 and capacitor 542. The resistance of the RC circuit is the parallel resistance of potentiometer 54 and calibration resistor 539. The calibration resistor 539 is installed during manufacturing and ensures that the load emits some illumination at the lowest setting of the potentiometer (this corresponds to potentiometer 54 being set at its maximum resistance.) In any event, the charging time of capacitor 542 is equal to the RC time constant of the RC timing circuit 108. Thus, the resistance of potentiometer 54 determines the RC time constant. When the capacitor 542 is charged to the breakover voltage of DIAC 240, the DIAC 240 will conduct to turn TRIAC 240N for a predetermined portion of the AC half-cycle. In other words, circuit 100 is able to vary the amount of power provided to the load by altering the duty cycle of the AC half cycle. Subsequent to TRIAC 24 turning ON, the voltage at capacitor 542 is zeroed such that DIAC 240 and TRIAC 24 turn on at about the same phase angle for both the positive and negative half cycles. Although the switching device is shown as a TRIAC, those skilled in the art that other switching devices may be employed such as bi-polar transistors, MOSFETS, gate turn-off thyristors, and SCRs.

Figure 16:
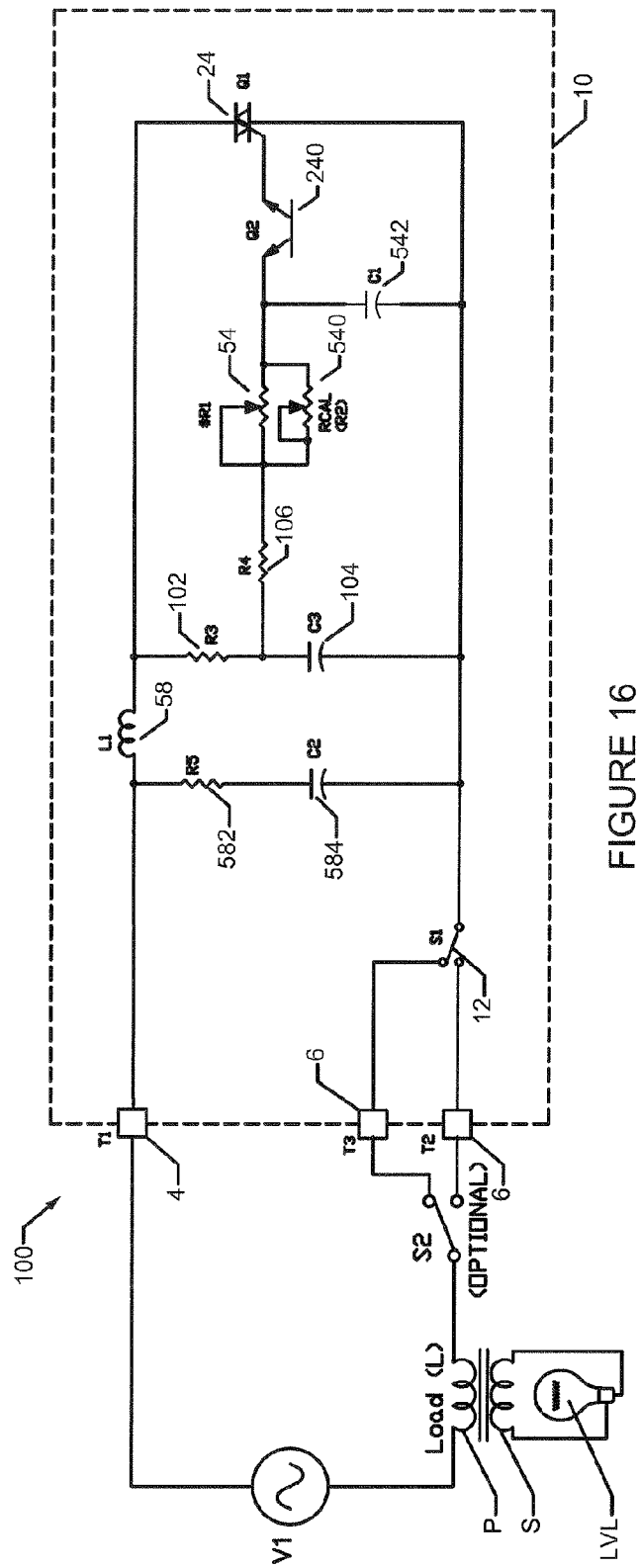
FIG. 16 is a schematic view of a circuit for a toggle switch and a variable actuator control in accordance with another embodiment of the invention.

As embodied herein and depicted in FIG. 16, a schematic view of a circuit for a toggle switch and a variable actuator control in accordance with another embodiment of the invention is disclosed. The dashed line indicates the portion of the schematic 100 that is disposed within device 10. The schematic of FIG. 16 is almost identical to the schematic of FIG. 15. Thus, for sake of brevity, only the differences between the two circuits will be discussed. The circuit 100 of FIG. 16 is directed to a low voltage lighting load application. Load L represents, e.g., a track lighting installation that includes a transformer T that has a primary P and a secondary S. The 120 VAC provided by AC voltage source is converted by the transformer T such that a low voltage power supply is provided to the transformer load, e.g. 12 V, for powering a low voltage light (LVL). Because of the variability associated with the load LVL, the calibration resistor 539 is implemented using preset variable control actuator 540 (trim potentiometer 540) that provides a variable low end adjustment.

Figure 17:
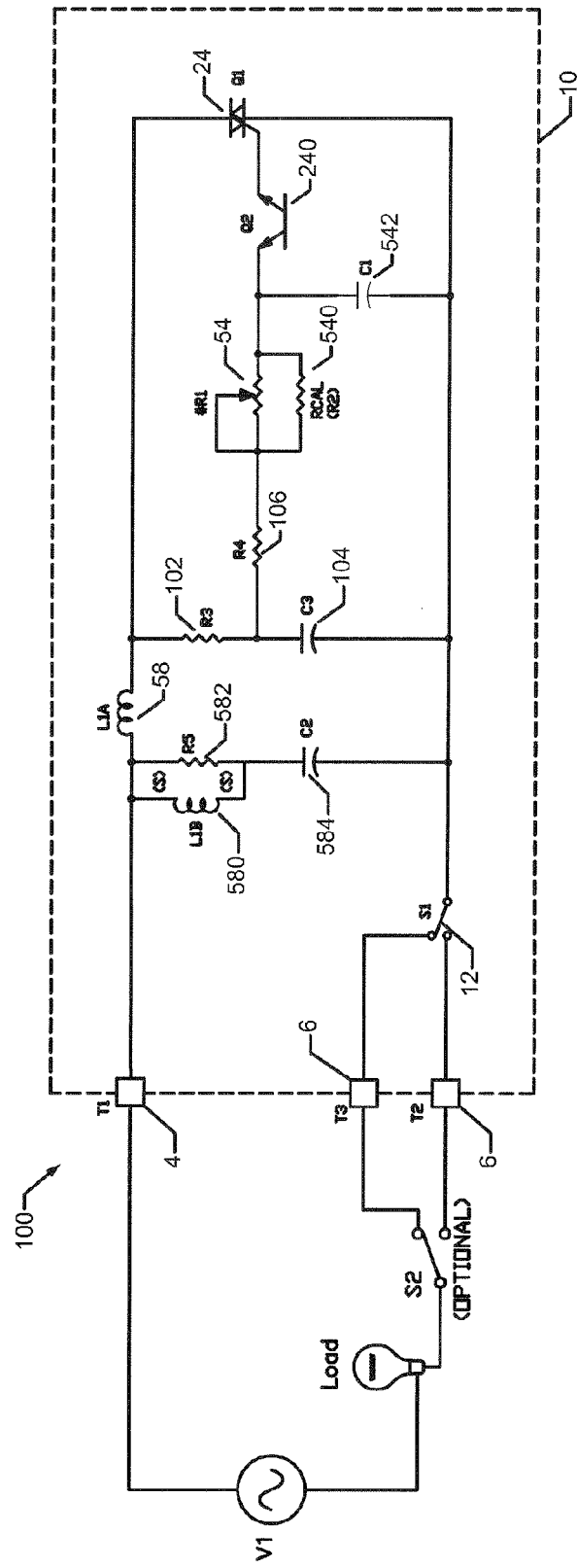
FIG. 17 is a schematic view of a circuit for a toggle switch and a variable actuator control in accordance with yet another embodiment of the invention.

As embodied herein and depicted in FIG. 17, a schematic view of a circuit for a toggle switch and a variable actuator control in accordance with yet another embodiment of the invention is disclosed. The dashed line indicates the portion of the schematic 100 that is disposed within device 10. Line neutral terminal 4 is connected to the source of AC power (V1). Traveler terminals 6 are connected to the traveler wires that extend from wall switch S2. Switch S2 is also connected to the source of AC power (V1) to complete the circuit. The layout of schematic of FIG. 17 is almost identical to the layout of schematic of FIG. 15 and, therefore, the description of identical circuitry is omitted for the sake of brevity. FIG. 17 is a relatively high power handling circuit of the type depicted in FIGS. 5 and 6. Thus, the choke coil of the RLC circuit includes coil 58 in combination with coil 580, which is disposed in parallel with resistor 582. Reference is made to U.S. Pat. No. 6,188,214, which is incorporated herein by reference as though fully set forth in its entirety, for a more detailed explanation of the choke coil circuit implementation. The value of certain resistors may also be adjusted in light of the higher currents associated with the embodiment of FIG. 17.

Figure 18:
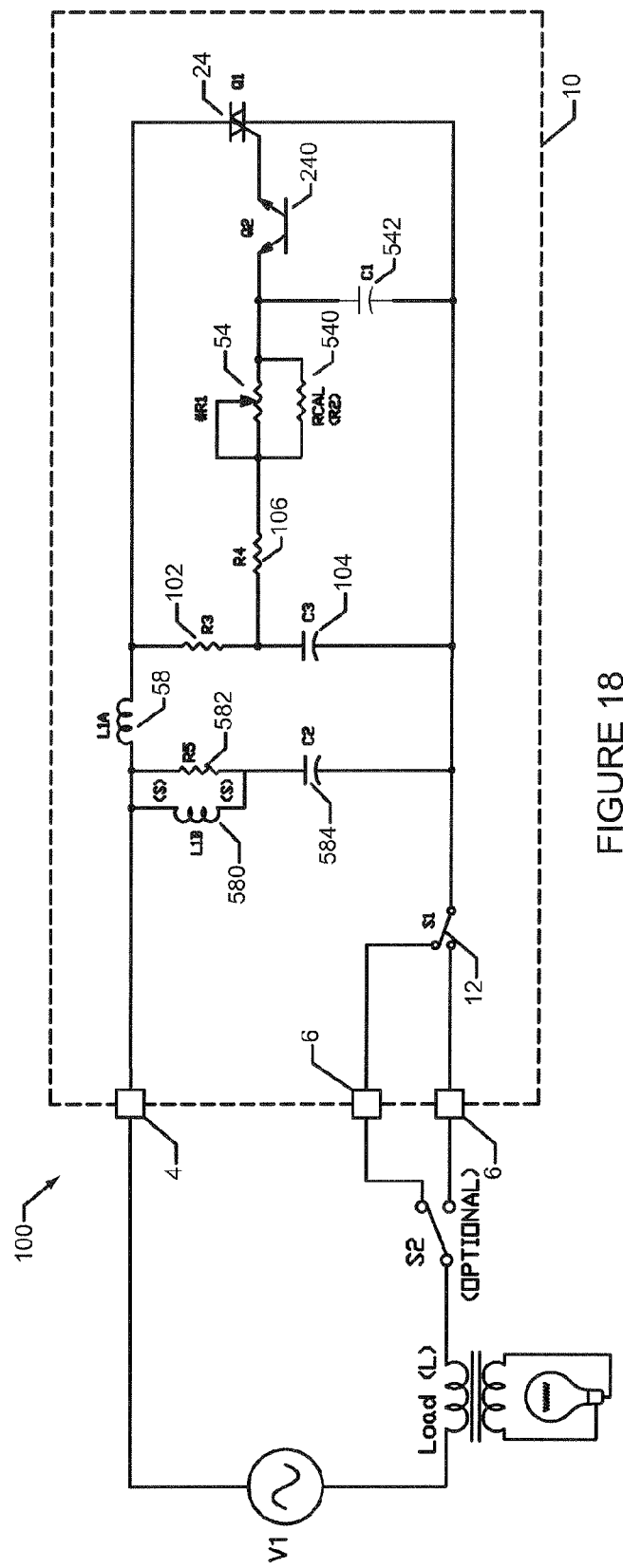
FIG. 18 is a schematic view of a circuit for a toggle switch and a variable actuator control in accordance with yet another embodiment of the invention.

As embodied herein and depicted in FIG. 18, a schematic view of a circuit for a toggle switch and a variable actuator control in accordance with yet another embodiment of the invention is disclosed. The dashed line indicates the portion of the schematic 100 that is disposed within device 10. The circuit of FIG. 18 is a relatively high power handling version of the circuit depicted in FIG. 16. The description of similar or identical circuitry, therefore, is omitted for the sake of brevity. Again, the choke coil of the RLC circuit includes coil 58 in combination with coil 580, which is disposed in parallel with resistor 582. Reference is made to U.S. Pat. No. 6,188,214, which is again incorporated herein by reference as though fully set forth in its entirety, for a more detailed explanation of the choke coil circuit implementation. The value of certain resistors may also be adjusted in light of the higher currents associated with the embodiment of FIG. 18.

Figure 19:
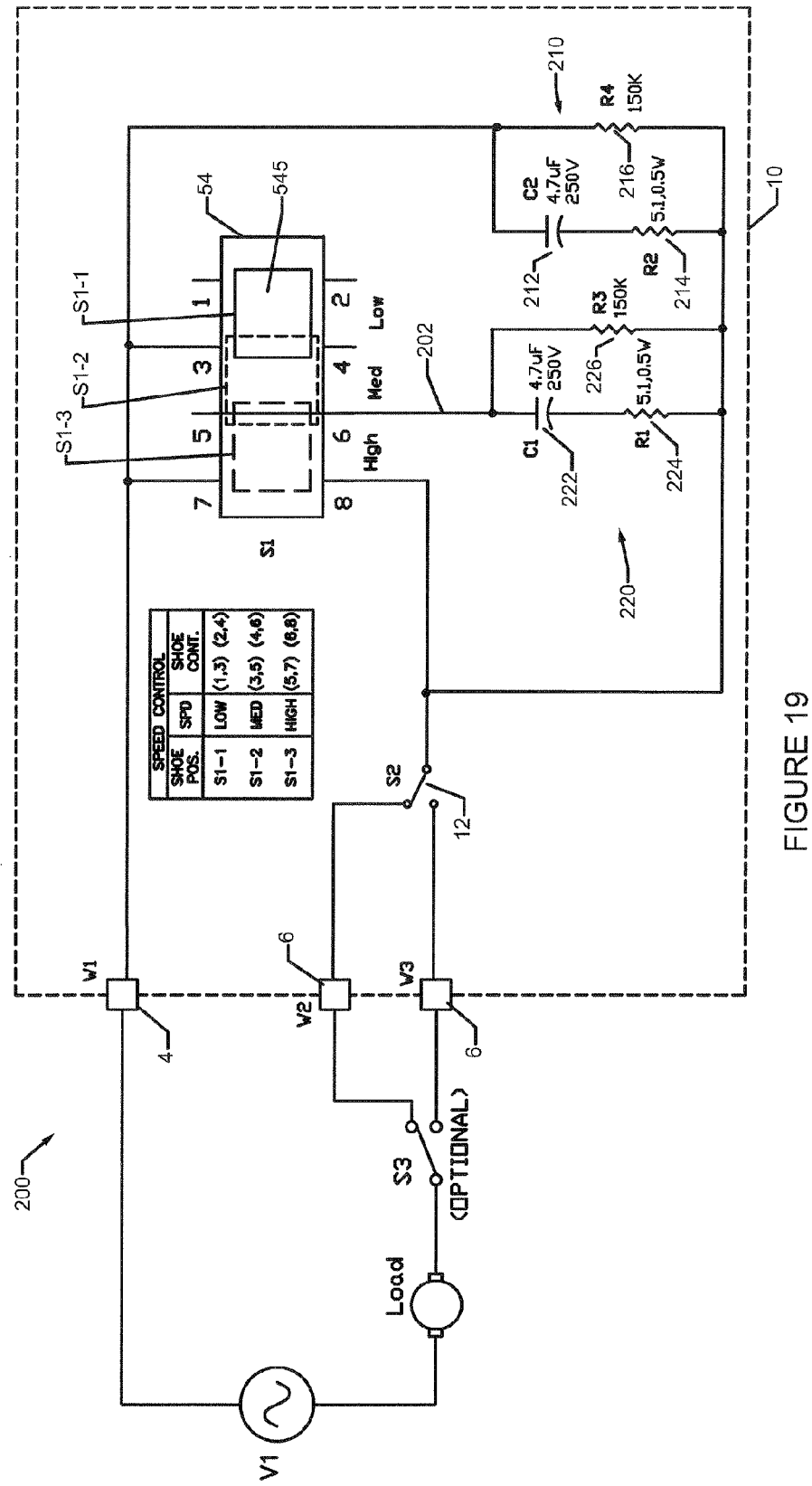
FIG. 19 is a schematic view of a circuit for a toggle switch and a variable actuator control in accordance with yet another embodiment of the invention.

As embodied herein and depicted in FIG. 19, a schematic view of a circuit for a toggle switch and a variable actuator control in accordance with yet another embodiment of the invention is disclosed. In this embodiment, the circuit 200 is a toggle switch and a dehummer variable fan speed control for the electric fan load (F). Circuit 200 includes slide switch 54 in combination with capacitive circuit 210 and capacitive circuit 220. The slide switch S1 includes a glider disposed in a switch housing that is mounted on the printed circuit board 500. The switch 54 includes dual contact springs on the bottom of the glider that interact with two rows of contacts. Each contact spring makes contact between adjacent contacts in the same row as the contact spring. Reference is made to U.S. Pat. No. 6,841,749, which is incorporated herein by reference as though fully set forth in its entirety, for a more detailed explanation of the slide switch 54 for the fan control circuit 200. Referring to schematic circuit 200, the glider 545 is shown on switch 54 at a low speed switch position S1-1 by a solid line, at a medium speed switch position S1-2 by a dashed line, and at a high speed switch position by a dotted line. At switch position S1-1, the contacts 1, 3 and 2, 4 are connected by the glider 545. Because contacts 1, 2 are not used, only capacitor circuit 210 is connected between line neutral terminal 4 and toggle switch 12. The inductive reactance of the fan and the capacitive reactance of the circuit form a voltage divider. The switch circuit 54 varies the capacitance of the circuit when the switch is in different positions. In switch position S1-2, contacts 3, 5 and 4, 6 are connected by the glider 545. Capacitor circuit 220 is disposed in parallel with capacitor circuit 210. Trace 202 is connected to contact 5 and thus to contact 3 by way of glider 545 when at position S1-2. Contact 3, as noted above, is connected to filter circuit 210. Thus, there is a reduced impedance between line neutral terminal 4 and toggle switch 43 and the fan speed is increased at position S1-2. When the glider position is moved to position S1-3, contacts 5,7 and 6,8 are connected. Since contacts 202 are shorted together by trace 202, contacts 7 and 8 are shorted together and the fan speed is at full power.

Figure 20:
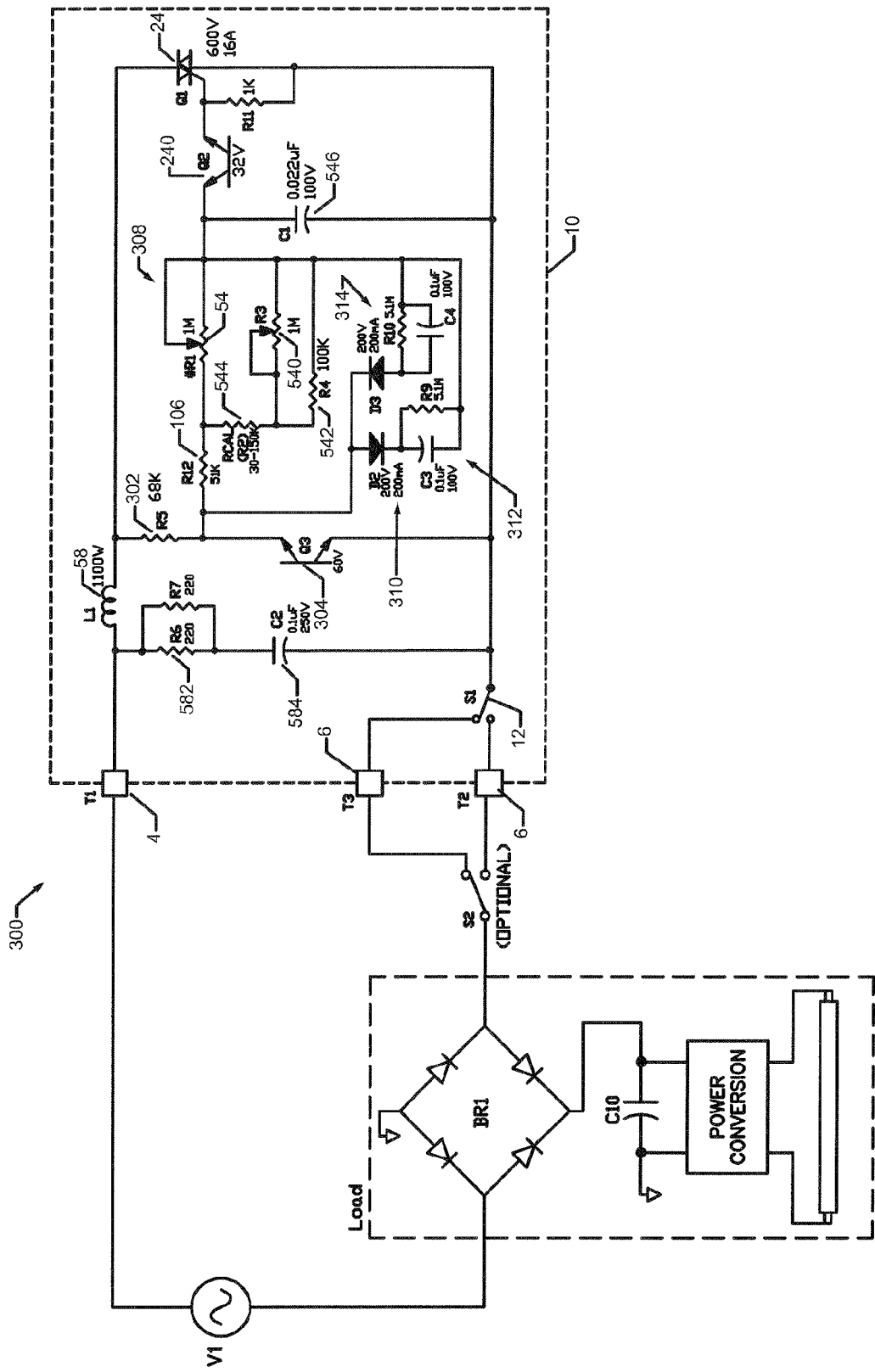
FIG. 20 is a schematic view of a circuit for a toggle switch and a variable actuator control in accordance with another embodiment of the invention.

As embodied herein and depicted in FIG. 20, a schematic view of a circuit for a toggle switch and a variable actuator control in accordance with another embodiment of the invention is disclosed. In this embodiment, the load includes a fluorescent light ballast configured to power a fluorescent light. The layout of circuit 300 is similar to the previous embodiments. The choke coil of the RLC circuit includes coil 58 which is disposed in series with resistors 582. As noted above, this circuit prevents noise generated by TRIAC 24 from propagating back into the electrical distribution system. The voltage regulation circuit includes resistor 302 and DIAC 304. This circuit is different from the voltage regulator circuits disclosed in the previous embodiments. Because the circuit 300 is designed for a fluorescent ballast load, DIAC 304 is employed instead of a capacitor because it is more robust noise filter. The fluorescent light load is more susceptible to voltage variations. DIAC 304 clamps the voltage at 60 V. The variable actuator circuitry 308 is more complicated than the circuitry employed in previous embodiments. Again, resistor 306 is a current limiting resistor.

The variable actuator circuitry 308 has four resistive components including user potentiometer 54 and trim potentiometer 540. Trim potentiometer 540 is disposed in parallel with resistor 542 and is employed by the user to adjust the low end setting of the dimmer. As shown in FIGS. 5 and 6, preset variable control actuator (trim potentiometer) 540 is hidden by wall plate 1. Calibration resistor 544 is carefully selected during manufacturing such that the lowest setting of the trim potentiometer 540 results in a minimum low level illumination of the florescent light. Thus, resistor 544 sets the absolute lowest dimmer setting, i.e., when potentiometer 54 and trim potentiometer 540 are at their lowest adjustment settings.

Circuit 300 includes a starting circuit 310 that is not included in any of the previous embodiments. Starting circuit 310 is disposed in parallel with the variable actuator circuitry 308 and is configured to shunt current around the actuator circuit 308 to DIAC 240 at start-up. Essentially, the ballast presents a high impedance to TRIAC 24 and, therefore, TRIAC 24 would not turn ON if not for the starting circuit 310. By turning DIAC 240 and TRIAC 240N at full output, the charging current through capacitor C10 becomes great enough for TRIAC 24 to turn ON. The fluorescent light will turn ON within 8-10 AC line cycles. As soon as the fluorescent light illuminates, there will be enough load current to keep TRIAC 24 ON. In state of the art fluorescent dimmers, a mechanical solution is employed to address the "mechanical" fluorescent ballast starting solution. In other words, one must turn the light ON using the full-power setting of the dimmer and adjust the dimmer to a desired setting thereafter. The present invention eliminates the mechanical fluorescent ballast starting solution and replaces it with an electronic starter circuit that allows the user to preset the florescent light at a desired intensity.

In particular, starting circuit 310 includes circuit 312 and circuit 314. Circuit 312 shunts current to DIAC 240 during the positive half-cycles of AC power, whereas circuit 314 shunts current to DIAC 240 during the negative half cycles of AC power. Thus, circuits 312 and 314 alternate between half-cycles of AC power until capacitors C3 and C4 are fully charged. Due to the charging, DIAC 240 is turned ON early in each AC half cycle so TRIAC 24 is ON at full power. Due to the fact that it takes longer than 8-10 AC line cycles for the capacitors to fully charge, circuits 312 and 314 assure that the fluorescent light will illuminate. Capacitors C3 and C4 eventually charge fully at which point circuits 312 and 314 have little or no affect on TRIAC 24. Instead, the actuator circuit 308 begins to fire DIAC 240 at the phase angle setting dictated by variable actuation circuit 308 in the manner previously described. When line voltage is turned off by switch by S2 (if provided) or switch 12, resistors R9 and R10, respectively, will bleed (discharge) capacitors C3 and C4 within a relatively short period of time (e.g., about a half-second). This assures that circuits 312 and 314 will be ready to restart the electronic ballast load when line voltage is restored.

The output circuit comprising DIAC 240 and TRIAC 24 includes a resistor 242 that is connected to the gate of TRIAC 24. Once DIAC 240 is OFF, resistor 242 bleeds current away from the gate of TRIAC 24 to guarantee its turn-off. TRIAC 24 may be referred to as a "sensitive gate TRIAC" meaning that it is capable of turning ON at low values of load current.

Figure 21A:
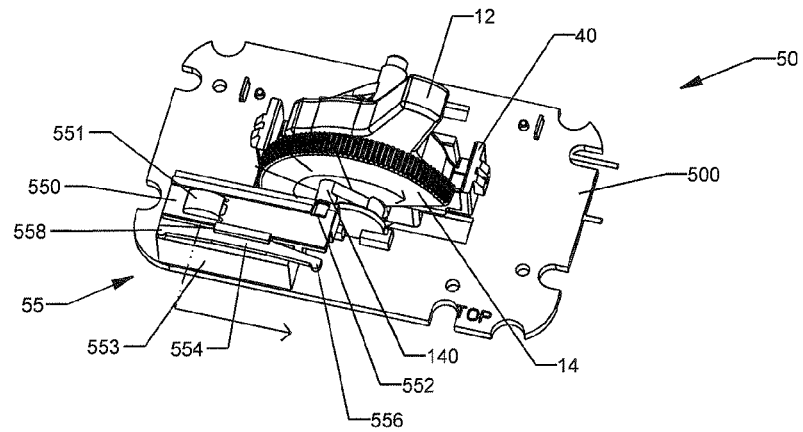
FIGS. 21A-21C are perspective views of the variable actuator, variable actuator linkage and slide switch in accordance with another embodiment of the present invention.
Figure 21B:
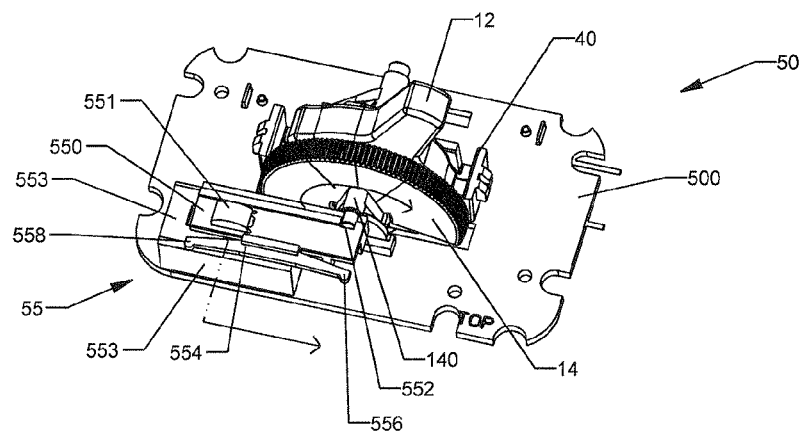
Figure 21C:
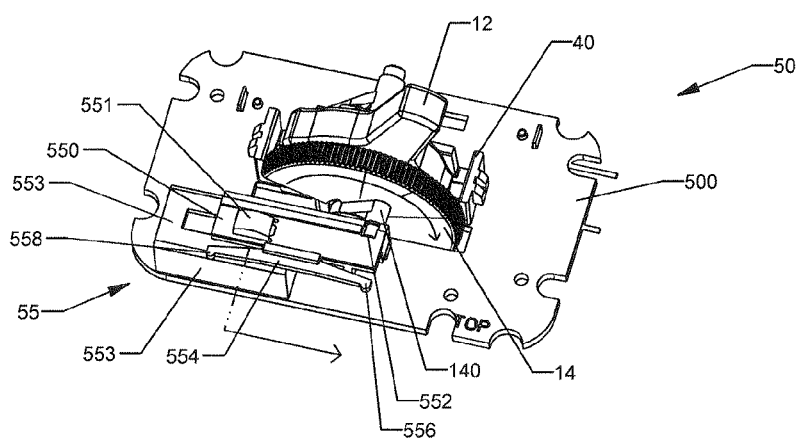

Referring to FIGS. 21A-21C, perspective views of the variable actuator, variable actuator linkage and slide switch in accordance with another embodiment of the present invention are disclosed. This embodiment corresponds to the toggle switch and variable fan speed control disclosed in FIG. 19 and the associated text. FIGS. 21A-21C show the toggle switch 12 and the rotary actuator 14 disposed in the modular switch assembly 40. The modular switch assembly is mounted within the printed circuit board in the manner previously described. The rotary actuator 14 mates with the slide switch 55 (S1). The slide switch 55 includes a slide actuator member 550 disposed over a lower slide body 553 which is also mounted on the printed circuit board 500. The slide actuator member includes an opening that accommodates a switch button 551 and a notch 552 that accommodates the linkage portion 140 therein. When the rotary actuator 14 is rotated by the user, the linkage portion 140 pulls the slide actuator member 550 in the direction indicated by the arrow such that switch button 551 moves the internal switch slider contacts from the LOW switch position to a higher speed switch position. In FIG. 21B, the slide switch 55 is shown in the MED fan speed position. FIG. 21C shows the slide switch 55 in the HIGH fan speed position. Thus, the linkage portion 140 converts the rotational movement of the rotary actuator 14 into a linear actuation motion of slide switch 55. Although three stepped switch positions are shown in FIG. 21, the invention is not to be limited to any particular number of positions.

The slide switch 55 also includes a flexible arm 554 which includes detents 556, 558 disposed on either end thereof. The function of the flexible arm 554 and detents 556, 558 is described below.

Those skilled in the art will understand that in this embodiment, the rotary actuator 14 is moved in discrete increments that correspond to the fan speed positions of the fan speed switch 55. In one alternate embodiment, these discrete positions may be discovered by the user through trial and error. In other words, as the rotary actuator 14 is incremented, the user will notice the speed of the fan changing. In another alternate embodiment, portions of the serrated surface 146 are removed and human readable indicia are printed or formed on the smoothed surface of dial 146 to indicate the fan speed position. For example, the letter "L" would be indicative of LOW, "M" for MEDIUM and "H" for HIGH. As noted herein, the switch speed is not limited to only three discrete positions. In such cases, numerical indicia (e.g., 1, 2, 3, 4, and 5) may be used to indicate the discrete position. Of course, other suitable indicia may be employed, such as combinations of colors or alphanumerics.

Figure 22A:
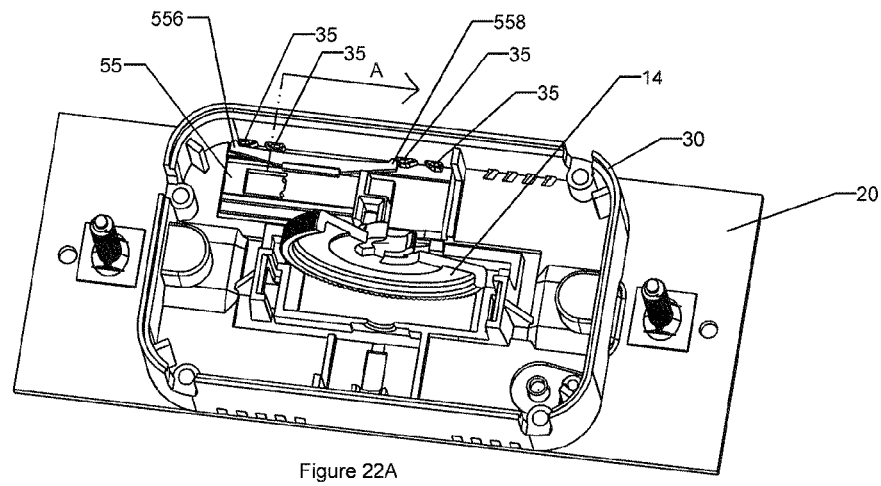
FIGS. 22A-22C are alternate perspective views of the variable actuator and slide switch depicted in FIGS. 21A-21C.
Figure 22B:
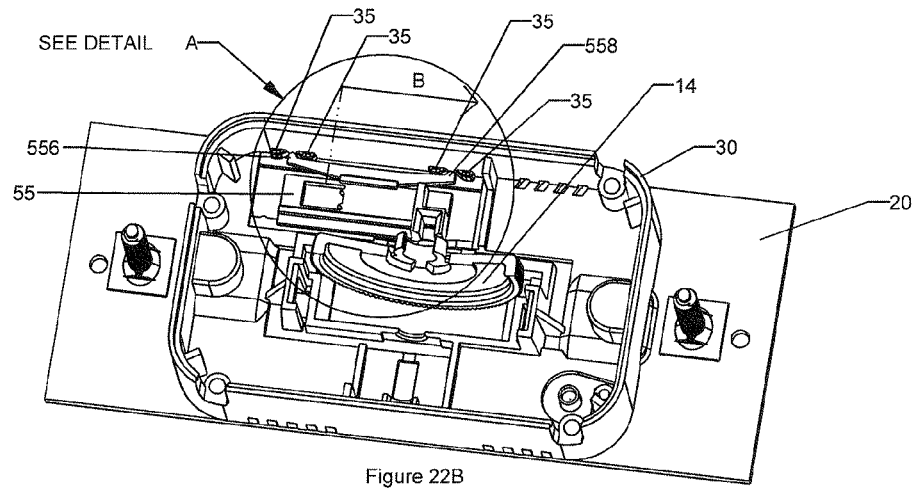
Figure 22C:
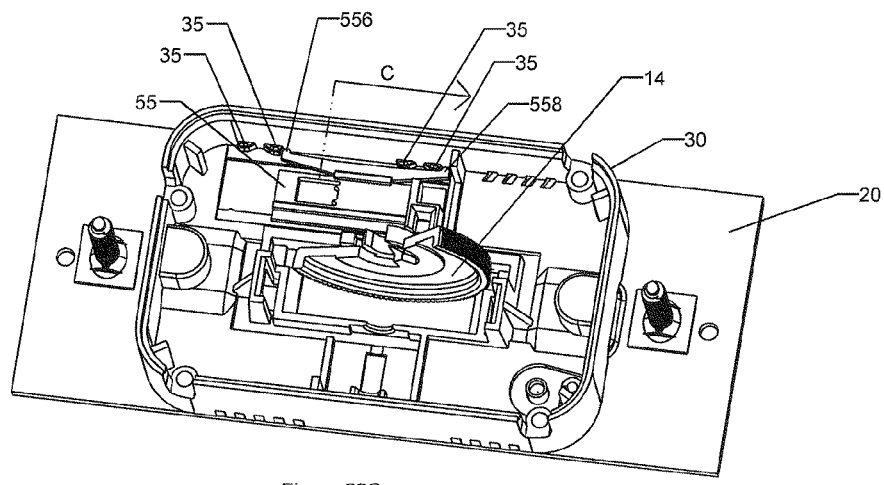

FIGS. 22A-22C are alternate perspective views of the variable actuator 14 and slide switch 55 depicted in FIGS. 21A-21C. These drawings show the rotary actuator 14 within the opening 38 of the separator 30. The separator member 30 includes four cammed stop elements 35. The cammed stop elements are divided into two pairs of stop elements 35. The leftward pair of stop elements 35 are configured to engage the detent 556 and the rightward pair of stop elements 35 are configured to engage the detent 558. Thus, the combination of the detents 556, 558 and the cammed stop elements 35 are used to resist any movement of the slide switch 55 away from the S1-1, S1-2 and S1-3 positions. See FIG. 19.

FIG. 22A corresponds to the LOW fan speed position shown in FIG. 21A. Detent 556 is disposed on the outboard side of the leftward pair of stop elements. Detent 558, on the other hand, is disposed on the inboard side of the rightward pair of stop elements. FIG. 22B corresponds to the MED fan speed position depicted in FIG. 21B. Note that detent 556 is disposed between the leftward pair of stop elements and detent 558 is disposed between the rightward pair of stop elements 35. FIG. 22C corresponds to the HIGH fan speed position shown in FIG. 21C. Detent 556 is disposed on the inboard side of the leftward pair of stop elements. Detent 558, on the other hand, is disposed on the outboard side of the rightward pair of stop elements and adjacent to the end stop feature 350 protruding from the interior side of separator 30.

Figure 23:
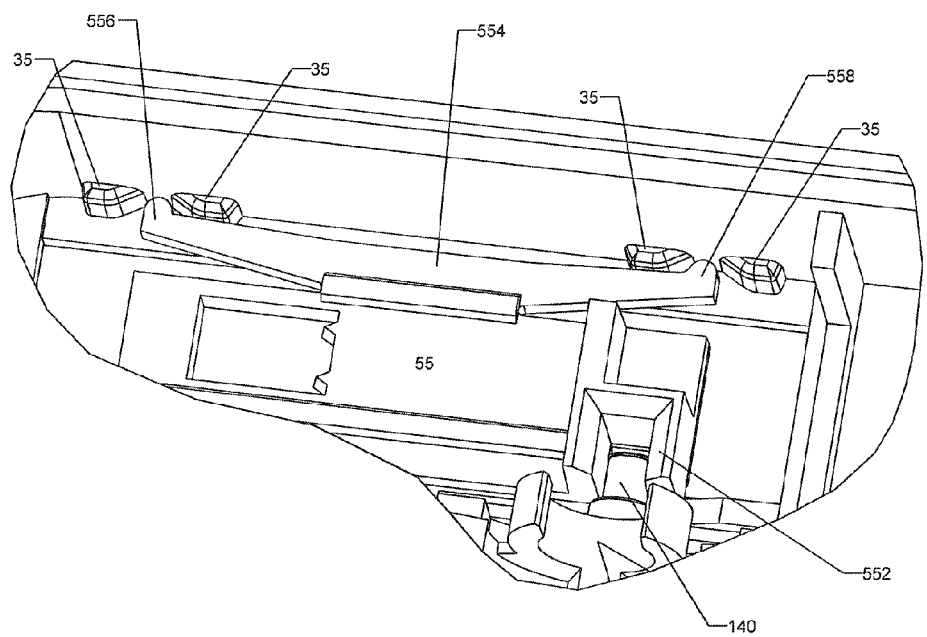
FIG. 23 is a detail view of the separator structure depicted in FIGS. 22A-22C.

FIG. 23 is a detail view of the separator structure depicted in FIG. 22B. This view clearly shows the position of detent 556 between the leftward pair of stop elements as well as the position of detent 558 between the rightward pair of stop elements 35. The linkage mechanism 140 is also shown within the notch 552. The depth of the notch 552 allows the linkage portion 140 to move up and down with the movement of the rotary actuator 140.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A device for regulating an amount of electrical power provided to at least one electrical load, the device comprising:
    a housing configured to be installed within a wall box, the housing including a front housing portion coupled to a back housing portion, the front housing portion including a front surface having a control aperture disposed therein, the housing portion further including a plurality of wiring terminals at least partially disposed in the housing;
    a control circuit disposed in the housing, the control circuit further including a power control element disposed on a mounting surface, the power control element including a linear actuator configured to vary the amount of power provided to the at least one electrical load based on a linear position of the linear actuator, the linear actuator being substantially perpendicular to the front surface and disposed between the mounting surface and the front surface; and
    a user control assembly accessible to the user via the control aperture and coupled to the linear actuator via a linkage structure, an adjustable portion of the user control assembly being characterized by a rotational motion about a control axis, the linkage structure including a pin and channel arrangement configured to convert the rotational motion of the adjustable portion into a linear motion by the linear actuator, the linear actuator being linearly movable within a range of positions, the channel including parallel walls configured to accommodate the pin, the parallel walls being substantially perpendicular to the mounting surface at each position within the range of positions.

2. The device of claim 1, further comprising a wall plate coupled to the front surface, the wall plate having a first dimension of approximately 0.925 inches and a second dimension of approximately 0.401 inches.

3. The device of claim 1, further comprising a wall plate coupled to the front surface, wherein the wall plate has an opening having an area less than approximately 0.50 square inches.

4. The device of claim 1, wherein the front housing portion includes a separator member having a frame member that extends through the control aperture, the frame member being configured to accommodate the user control assembly.

5. The device of claim 1, wherein the front housing portion includes a heat sink thermodynamically coupled to the control circuit.

6. The device of claim 1, wherein the front housing portion includes a separator member.

7. The device of claim 1, wherein the adjustable portion includes a substantially semi-circular wheel portion having a user accessible edge.

8. The device of claim 7, wherein the substantially semi-circular wheel portion defines a reflex angle.

9. The device of claim 7, wherein the linkage structure pin is disposed at a predetermined position between the user accessible edge and the control axis.

10. The device of claim 1, wherein a portion of the pin and channel arrangement is disposed at a predetermined radial distance from the control axis.

11. The device of claim 10, wherein the control circuit includes a thyristor switching element.

12. The device of claim 11, wherein the front housing portion includes a heat sink thermo-dynamically coupled to the thyristor switching element.

13. The device of claim 1, wherein the variable power control element is a slide potentiometer.

14. The device of claim 13, wherein the slide potentiometer is disposed proximate a first lateral edge of a printed circuit board.

15. The device of claim 1, wherein the variable power control element includes a plurality of discrete power settings.

16. The device of claim 15, wherein the variable power control element is a slide switch.

17. The device of claim 15, wherein the adjustable portion includes discrete rotational positions.

18. The device of claim 17, wherein the adjustable portion includes a substantially semi-circular wheel portion having a user accessible edge.

19. The device of claim 15, wherein each of the plurality of discrete power settings corresponds to one of a plurality of capacitance elements corresponding to a predetermined capacitance value.

20. The device of claim 1, wherein the variable power control element includes a slide switch mechanism having a flexible arm member, the flexible arm member having at least one detent structure disposed at an end thereof, each of the plurality of detent positions corresponding to one of the plurality of linearly actuated discrete power settings.

21. The device of claim 20, wherein the at least one detent structure includes a first detent structure and a second detent structure disposed at either end of the flexible arm member.

22. The device of claim 1, wherein the control circuit includes at least one switch device movable between a first switch state and a second switch state.

23. The device of claim 1, wherein the control circuit includes a starter circuit disposed substantially in parallel with a dimmer circuit, the starting circuit being configured to by-pass the dimmer circuit and couple a substantial portion of the electrical power to the at least one electrical load for a predetermined period of time when the electrical power is initially applied to the electronic control circuit.

24. The device of claim 23, wherein the at least one electrical load includes a fluorescent ballast load.

25. The device of claim 1, wherein the control circuit includes a dimming circuit, the dimming circuit including a manual preset or a factory preset.

26. The device of claim 25, further comprising a wall plate coupled to the front surface, wherein the manual preset is accessible to the user when the device is not covered by the wall plate.

27. A device for regulating an amount of electrical power provided to at least one electrical load, the device comprising:
   a housing configured to be installed within a wall box, the housing including a front housing portion coupled to a back housing portion, the front housing portion including a front surface having a control aperture disposed therein, the housing portion further including a plurality of wiring terminals at least partially disposed in the housing;
   a control circuit disposed in the housing and including at least one switch device movable between a first switch state and a second switch state, the control circuit further including a power control device disposed on a mounting surface, the power control device including a linear actuator configured to adjust the amount of electrical power, the linear actuator being substantially perpendicular to the front surface;
   a user-accessible control assembly coupled to the control circuit via the control aperture, the user-accessible control assembly including a switch control element coupled to the at least one switch device and a variable control element coupled to the linear actuator via a linkage structure, the variable control element being characterized by a rotational motion about a control axis, the linkage structure including a pin and channel arrangement configured to convert the rotational motion of the variable control element into linear motion by the linear actuator.

28. The device of claim 27, further comprising a wall plate coupled to the front housing, wherein the switch control element and the variable control element are user accessible via an opening in the wall plate having a first dimension of approximately 0.925 inches and a second dimension of approximately 0.401 inches.

29. The device of claim 27, further comprising a wall plate coupled to the front housing, wherein the switch control element and the variable control element are user accessible via an opening in the wall plate whose area is less than approximately 0.50 square inches.

30. The device of claim 27, wherein the front housing portion includes a separator member having a frame member that extends through the control aperture to frame at least the switch control element.

31. The device of claim 30, further comprising a wall plate coupled to the front housing, wherein the switch control element, the variable control element and the frame member are accommodated by an opening in the wall plate having a first dimension of approximately 0.925 inches and a second dimension of approximately 0.401 inches.

32. The device of claim 30, further comprising a wall plate coupled to the front housing, wherein the switch control element, the variable control element and the frame member are accommodated by an opening in the wall plate whose area is less than approximately 0.50 square inches.

33. The device of claim 27, wherein the front housing portion includes a heat sink thermodynamically coupled to the control circuit.

34. The device of claim 27, wherein the front housing portion includes a separator member.

35. The device of claim 34, wherein the switch control element and the variable control element are coupled to the separator by way of an actuator retainer housing in a side-by-side relationship.

36. The device of claim 35, wherein the actuator retainer housing is mounted to the separator and the mounting surface.

37. The device of claim 27, further comprising an actuator retainer housing coupled to the housing and configured to couple the switch control element and the variable control element in a side-by-side arrangement with no framing or support structure disposed therebetween.

38. The device of claim 37, wherein the switch control element is configured to rotate between a first predefined position and a second predefined position established by stop portions on the actuator retainer housing.

39. The device of claim 37, wherein the control circuit further comprises a printed circuit board having a printed circuit board opening disposed in an interior portion thereof, the actuator retainer housing being at least partially disposed in the printed circuit board opening.

40. The device of claim 27, wherein the at least one switch device comprises a toggle switch assembly including a toggle trunion element establishing a toggle axis of rotation and at least one switch actuator, the switch control element and the at least one switch actuator being coupled to the trunion in a predefined offset relationship, the at least one switch actuator being configured to actuate at least one switch when the toggle trunion element rotates in response to the switch control element are manipulated.

41. The device of claim 40, wherein the toggle trunion element snaps into a mounting structure coupled to the housing.

42. The device of claim 41, wherein the variable control element is coupled to a control trunion element that establishes the control axis, wherein the control trunion element snaps into the mounting structure.

43. The device of claim 40, wherein the toggle axis and the control axis are substantially parallel to a latitudinal axis of the housing.

44. The device of claim 40, wherein the toggle axis and the control axis are substantially co-linear.

45. The device of claim 40, wherein the toggle switch assembly further includes a spring element configured to drive the toggle switch actuator between the first switch state and the second switch state.

46. The device of claim 27, wherein the variable control element includes a substantially semi-circular wheel portion having a user accessible edge.

47. The device of claim 46, wherein the substantially semi-circular wheel portion defines a reflex angle.

48. The device of claim 46, wherein the linkage structure includes the pin being disposed at a predetermined position between the user accessible edge and the control axis.

49. The device of claim 27, wherein a portion of the pin and channel arrangement is disposed at a predetermined radial distance from the control axis.

50. The device of claim 49, wherein the control circuit includes a solid state switching element.

51. The device of claim 50, wherein the front housing portion includes a heat sink thermo-dynamically coupled to the solid state switching element.

52. The device of claim 1, wherein the power control device is a slide potentiometer.

53. The device of claim 52, wherein the slide potentiometer is disposed proximate a first lateral edge of the printed circuit board.

54. The device of claim 27, wherein the power control device includes a plurality of discrete power settings.

55. The device of claim 54, wherein the power control device is a slide switch.

56. The device of claim 54, wherein the variable control device includes discrete rotational positions.

57. The device of claim 54, wherein the variable control element includes a substantially semi-circular wheel portion having a user accessible edge.

58. The device of claim 54, wherein each of the plurality of discrete power settings corresponds to one of a plurality of capacitance elements corresponding to a predetermined capacitance value.

59. The device of claim 54, wherein the power control device includes a slide switch mechanism including a flexible arm member having at least one detent structure disposed at an end thereof, each of the plurality of detent positions corresponding to one of the plurality of linearly actuated discrete power settings.

60. The device of claim 59, wherein the at least one detent structure includes a first detent structure and a second detent structure disposed at either end of the flexible arm member.

61. The device of claim 27, wherein the control circuit includes a starter circuit disposed substantially in parallel with a dimmer circuit, the starting circuit being configured to by-pass the dimmer circuit and couple a substantial portion of the electrical power to the at least one electrical load for a predetermined period of time when the electrical power is initially applied to the electronic control circuit.

62. The device of claim 61, wherein the at least one electrical load includes a fluorescent ballast load.

63. The device of claim 27, wherein the control circuit includes a dimming circuit, the dimming circuit including a manual preset or a factory preset.

64. The device of claim 63, further comprising a wall plate coupled to the front housing, wherein the manual preset is accessible to the user when the device is not covered by the wall plate.

65. A device for regulating an amount of electrical power provided to at least one electrical load, the device comprising:
a housing configured to be installed within a wall box, the housing including a front housing portion coupled to a back housing portion, the front housing portion including a control aperture disposed therein, the housing portion further including a plurality of wiring terminals at least partially disposed in the housing;
a control circuit disposed in the housing and including at least one switch device movable between a first switch state and a second switch state, the control circuit further including a power control element disposed on a mounting surface, the power control element including a power control actuator configured to adjust the amount of power provided to the at least one electrical load;
a toggle switch actuator coupled to the at least one switch device and accessible to a user via the control aperture; and
a variable control actuator accessible to the user via the control aperture and coupled to the power control actuator via a linkage structure, the linkage structure further including a pin and channel arrangement configured to convert a user control action into a power control actuator adjustment by translating rotational motion into linear motion or linear motion into rotational motion.

66. The device of claim 65, further comprising a wall plate coupled to the front housing, wherein the toggle switch actuator and the variable control actuator are user accessible via an opening in the wall plate having a first dimension of approximately 0.925 inches and a second dimension of approximately 0.401 inches.

67. The device of claim 65, further comprising a wall plate coupled to the front housing, wherein the toggle switch actuator and the variable control actuator are user accessible via an opening in the wall plate whose area is less than approximately 0.50 square inches.

68. The device of claim 65, wherein the front housing portion includes a separator member having a frame member that extends through the control aperture to frame the toggle switch actuator or the variable control actuator.

69. The device of claim 65, wherein the front housing portion includes a heat sink thermodynamically coupled to the electronic circuit.

70. The device of claim 65, wherein the front housing portion includes a separator member.

71. The device of claim 70, wherein the toggle switch actuator and the variable control actuator are coupled to the separator by way of an actuator retainer housing in a side-by-side relationship.

72. The device of claim 71, wherein the actuator retainer housing is mounted to the separator and the mounting surface.

73. The device of claim 65, further comprising an actuator retainer housing coupled to the housing and configured to couple the toggle switch actuator and the variable control actuator in a side-by-side arrangement with no framing or support structure disposed therebetween.

74. The device of claim 73, wherein the toggle switch actuator is configured to rotate between a first predefined position and a second predefined position established by stop portions on the actuator retainer housing.

75. The device of claim 73, wherein the control circuit further comprises a printed circuit board having a printed circuit board opening disposed in an interior portion thereof, the actuator retainer housing being at least partially disposed in the printed circuit board opening.

76. The device of claim 65, wherein the toggle switch assembly includes a toggle trunion element establishing a toggle axis of rotation and at least one switch actuator, the toggle switch actuator and the at least one switch actuator being coupled to the trunion in a predefined offset relationship, the at least one switch actuator being configured to actuate at least one switch when the toggle trunion element rotates in response to the toggle switch actuator being manipulated.

77. The device of claim 76, wherein the toggle trunion element snaps into a mounting structure coupled to the housing.

78. The device of claim 76, wherein the variable control assembly includes a control trunion element that establishes the control axis, wherein the control trunion element snaps into the mounting structure.

79. The device of claim 76, wherein the toggle axis and the control axis are substantially parallel to a latitudinal axis of the housing.

80. The device of claim 76, wherein the toggle axis and the control axis are substantially co-linear.

81. The device of claim 76, wherein a spring element coupled to the toggle switch actuator, the spring being configured to drive the toggle switch actuator to a first predefined position and a second predefined position.

82. The device of claim 65, wherein the variable control actuator includes a substantially semi-circular wheel portion having a user accessible edge.

83. The device of claim 65, wherein a portion of the pin and channel arrangement is disposed at a predetermined radial distance from the control axis.

84. The device of claim 83, wherein the control circuit includes a solid state switching element.

85. The device of claim 84, wherein the front housing portion includes a heat sink thermo-dynamically coupled to the solid state switching element.

86. The device of claim 85, wherein the power control element is a slide potentiometer.

87. The device of claim 65, wherein the power control element includes a plurality of discrete power settings.

88. The device of claim 65, wherein the control circuit includes a starter circuit disposed substantially in parallel with a dimmer circuit, the starting circuit being configured to by-pass the dimmer circuit and couple a substantial portion of the electrical power to the at least one electrical load for a predetermined period of time when the electrical power is initially applied to the electronic control circuit.

89. The device of claim 88, wherein the at least one electrical load includes a fluorescent ballast load.

90. The device of claim 65, wherein the control circuit includes a dimming circuit, the dimming circuit including a manual preset or a factory preset.

91. The device of claim 90, further comprising a wall plate coupled to the front housing, wherein the manual preset is accessible to the user when the device is not covered by the wall plate.

* * * * *